(12) United States Patent
Okamori et al.

(10) Patent No.: US 12,348,867 B2
(45) Date of Patent: Jul. 1, 2025

(54) IMAGING DEVICE

(71) Applicant: FUJIFILM Corporation, Tokyo (JP)

(72) Inventors: Kazuaki Okamori, Saitama (JP); Yoshihiro Hayashi, Saitama (JP); Kazunori Tamura, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 110 days.

(21) Appl. No.: 18/296,968

(22) Filed: Apr. 6, 2023

(65) Prior Publication Data

US 2023/0247294 A1 Aug. 3, 2023

Related U.S. Application Data

(63) Continuation of application No. PCT/JP2021/037364, filed on Oct. 8, 2021.

(30) Foreign Application Priority Data

Oct. 9, 2020 (JP) ................................. 2020-171138

(51) Int. Cl.
*H04N 23/68* (2023.01)
*G03B 17/12* (2021.01)
(Continued)

(52) U.S. Cl.
CPC .......... *H04N 23/683* (2023.01); *G03B 17/12* (2013.01); *G03B 17/26* (2013.01); *H04N 23/50* (2023.01); *H05K 1/028* (2013.01); *H05K 1/0286* (2013.01)

(58) Field of Classification Search
CPC ...... H04N 23/683; H04N 23/50; H04N 23/55; H04N 23/57; H04N 23/54; H04N 23/687; G03B 17/12; G03B 17/26; G03B 17/561; G03B 5/00; G03B 17/02; H05K 1/028; H05K 1/0286; H05K 1/147
See application file for complete search history.

(56) References Cited

U.S. PATENT DOCUMENTS

| 10,674,089 | B2 | 6/2020 | Iseno | |
| 2012/0188720 | A1* | 7/2012 | Okuie | H04N 23/54 361/704 |
| 2012/0236579 | A1* | 9/2012 | Uemura | H05K 1/0219 174/254 |

(Continued)

FOREIGN PATENT DOCUMENTS

| JP | 2007116481 | 5/2007 |
| JP | 2012156581 | 8/2012 |

(Continued)

OTHER PUBLICATIONS

"International Search Report (Form PCT/ISA/210) of PCT/JP2021/037364", mailed on Dec. 7, 2021, with English translation thereof, pp. 1-5.

(Continued)

*Primary Examiner* — Christopher K Peterson
(74) *Attorney, Agent, or Firm* — JCIPRNET

(57) ABSTRACT

An imaging device includes an imaging element, a holding unit that holds the imaging element, a support unit that supports the holding unit such that the holding unit is movable, coils that drive the holding unit, flexible printed boards that are connected to the imaging element or the coils, a control board that is connected to the imaging element or the coils via the flexible printed boards, and a through-hole through which the flexible printed boards are to pass.

18 Claims, 19 Drawing Sheets

(51) Int. Cl.
    *G03B 17/26*     (2021.01)
    *H04N 23/50*     (2023.01)
    *H05K 1/02*     (2006.01)

(56) References Cited

U.S. PATENT DOCUMENTS

| | | | | |
|---|---|---|---|---|
| 2012/0287317 | A1* | 11/2012 | Tobinaga | H04N 23/811 |
| | | | | 348/294 |
| 2014/0160284 | A1* | 6/2014 | Achenbach | H04N 23/57 |
| | | | | 29/854 |
| 2020/0120251 | A1* | 4/2020 | Toda | H05K 1/148 |

FOREIGN PATENT DOCUMENTS

| | | |
|---|---|---|
| JP | 2012195456 | 10/2012 |
| JP | 2014191283 | 10/2014 |
| JP | 2018185496 | 11/2018 |
| JP | 2019200349 | 11/2019 |
| JP | 2020064281 | 4/2020 |
| JP | 2021173943 | 11/2021 |
| WO | 2012104930 | 8/2012 |
| WO | 2020202811 | 10/2020 |

OTHER PUBLICATIONS

"Written Opinion of The International Searching Authority (Form PCT/ISA/237) of PCT/JP2021/037364", mailed on Dec. 7, 2021, with English translation thereof, pp. 1-6.

"Notice of Reasons for Refusal of Japan Counterpart Application No. 2022-555592", issued on May 7, 2025, with English translation thereof, p. 1-p. 20.

* cited by examiner

FIG. 3
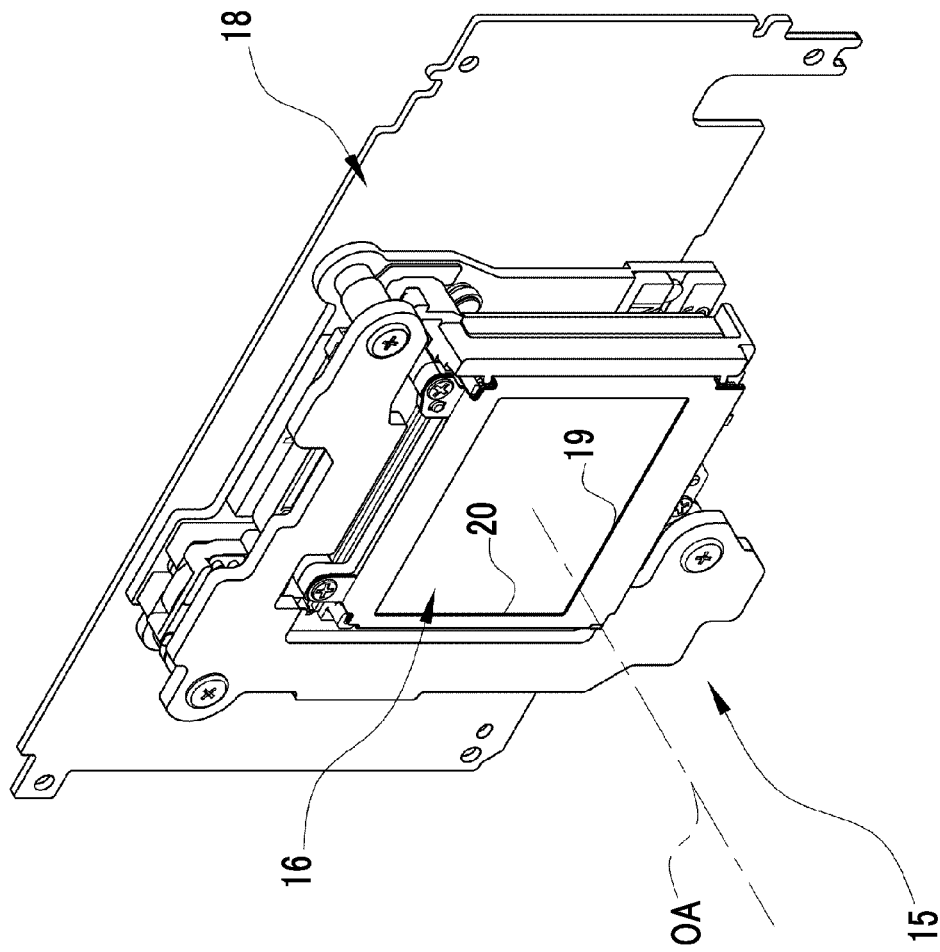
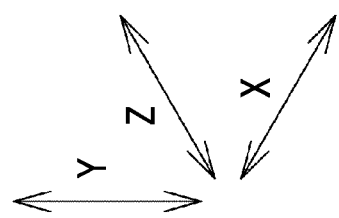

US 12,348,867 B2

IMAGING DEVICE

CROSS-REFERENCE TO RELATED APPLICATIONS

This application is a Continuation of PCT International Application No. PCT/JP2021/037364 filed on 8 Oct. 2021, which claims priority under 35 U.S.C § 119(a) to Japanese Patent Application No. 2020-171138 filed on 9 Oct. 2020. The above application is hereby expressly incorporated by reference, in its entirety, into the present application.

BACKGROUND OF THE INVENTION

1. Field of the Invention

The present invention relates to an imaging device.

2. Description of the Related Art

There is an imaging device that comprises a vibration isolator that displaces an imaging element to optically correct a shake. The imaging device comprising such a vibration isolator comprises a drive unit that displaces a holding unit holding the imaging element, and the drive unit drives the holding unit in a plane perpendicular to an optical axis to correct a shake. A support unit that supports the holding unit and a control board that controls the imaging element and the drive unit are fixed on a side of the imaging device facing a housing. The imaging element and the drive unit are electrically connected to the control board by a flexible printed board. With the flexibility of the flexible printed board, the imaging element and the drive unit are electrically connected to the control board and the imaging element is made movable.

In an imaging device disclosed in JP2019-200349A, a flexible printed board connected to an imaging element and a drive unit extends in a vertical direction and a portion, which extends in the vertical direction, of the flexible printed board is bent and is connected to a control board on a surface opposite to a surface facing the imaging element.

SUMMARY OF THE INVENTION

An embodiment of a technique of the present disclosure provides an imaging device of which a housing can be reduced in size and in which drive loads of flexible printed boards can be reduced.

An imaging device according to an aspect of the present invention comprises an imaging element, a holding unit, a support unit, a drive unit, a flexible board, a control board, and a through-hole. The imaging element includes an imaging surface imaging a subject. The holding unit holds the imaging element. The support unit supports the holding unit such that the holding unit is movable in a plane perpendicular to an optical axis. The drive unit drives the holding unit in the plane perpendicular to the optical axis. The flexible board is electrically connected to the imaging element or the drive unit. The control board is electrically connected to the imaging element or the drive unit via the flexible board. The through-hole is formed in the control board, and the flexible board is to pass through the through-hole.

An imaging device according to another aspect of the present invention comprises an imaging element, a holding unit, a support unit, a drive unit, a flexible board, a control board, a notch, and a first plate. The imaging element includes an imaging surface imaging a subject. The holding unit holds the imaging element. The support unit supports the holding unit such that the holding unit is movable in a plane perpendicular to an optical axis. The drive unit drives the holding unit in the plane perpendicular to the optical axis. The flexible board is electrically connected to the imaging element or the drive unit. The control board is electrically connected to the imaging element or the drive unit via the flexible board. The notch is formed in the control board and notched from one side of the control board, and the flexible board is to pass through the notch. The first plate is provided on a surface of the control board opposite to a surface of the control board facing the imaging element and is in contact with the flexible board.

It is preferable that the flexible board extends in a center direction of the imaging element in a plane parallel to the imaging surface.

It is preferable that a plurality of the flexible boards are provided. It is preferable that the imaging device further comprises a first flexible board fixing part which is provided on the holding unit and to which one end of the flexible board is to be fixed, a plurality of the flexible boards are provided, a portion, which extends from the first flexible board fixing part, of at least one of the flexible boards is disposed parallel to a first direction parallel to the imaging surface, and a portion, which extends from the first flexible board fixing part, of another of the flexible boards is disposed parallel to a second direction parallel to the imaging surface and orthogonal to the first direction.

It is preferable that the imaging device further comprises a first plate that is provided on a surface of the control board opposite to a surface of the control board facing the imaging element and is in contact with the flexible board. It is preferable that the imaging device further comprises a second flexible board fixing part which is provided on the control board and is disposed on a second surface opposite to a first surface facing the imaging element and to which the other end of the flexible board is to be fixed. It is preferable that, in a case where a distance between the first and second flexible board fixing parts in a longitudinal direction of the flexible board is denoted by L1, a diameter of a bent portion of the flexible board is denoted by d, and a length of the flexible board in the longitudinal direction is denoted by L2, a relationship of "L2>L1+πd/2" is satisfied.

It is preferable that the first plate is made of a material having a heat dissipation effect. It is preferable that the imaging device further comprises a second plate that is provided on a side of the control board facing the imaging element. It is preferable that the second plate is provided on the holding unit. It is preferable that the first and second plates include friction reducing parts.

BRIEF DESCRIPTION OF THE DRAWINGS

FIG. 3 is a perspective view of a vibration isolator.

DESCRIPTION OF THE PREFERRED EMBODIMENTS

First Embodiment

Figure 1:
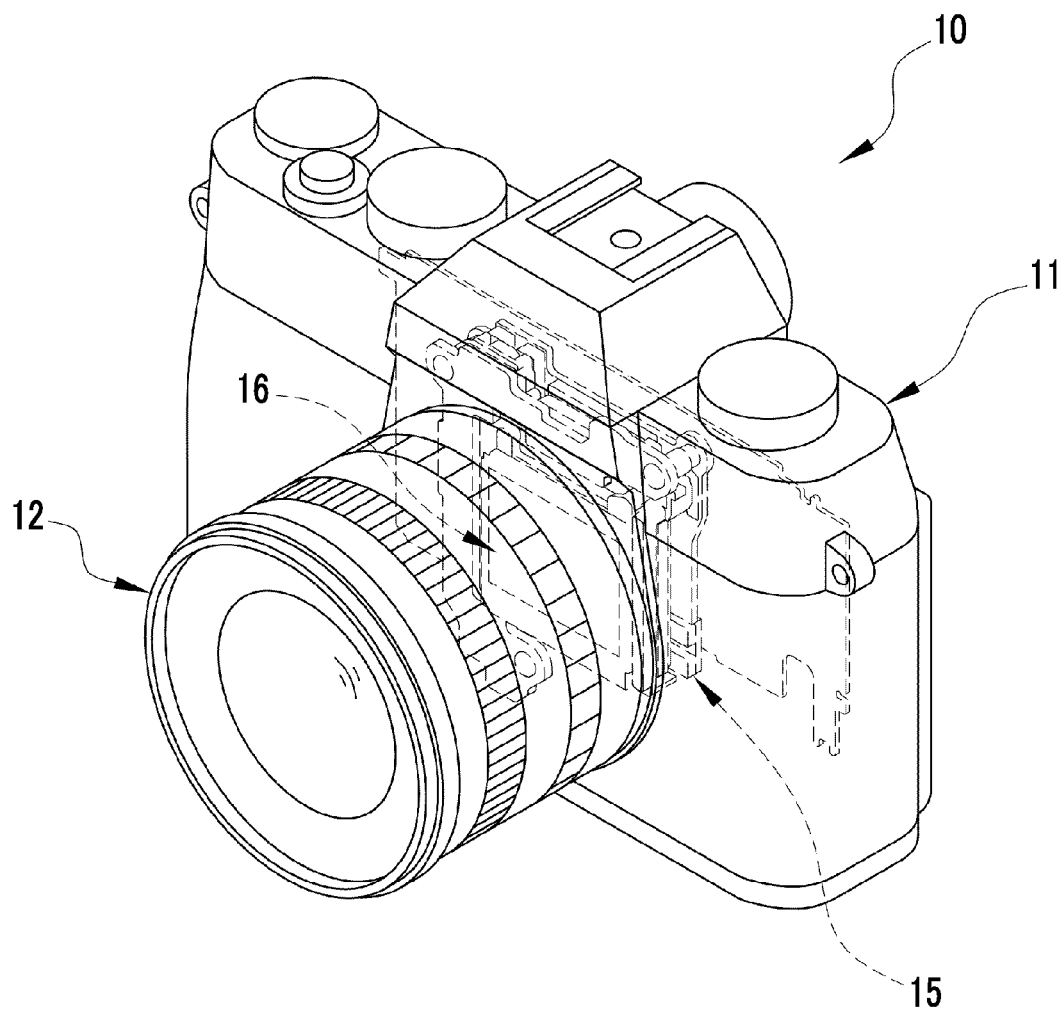
FIG. 1 is a perspective view of an imaging device.
Figure 2:
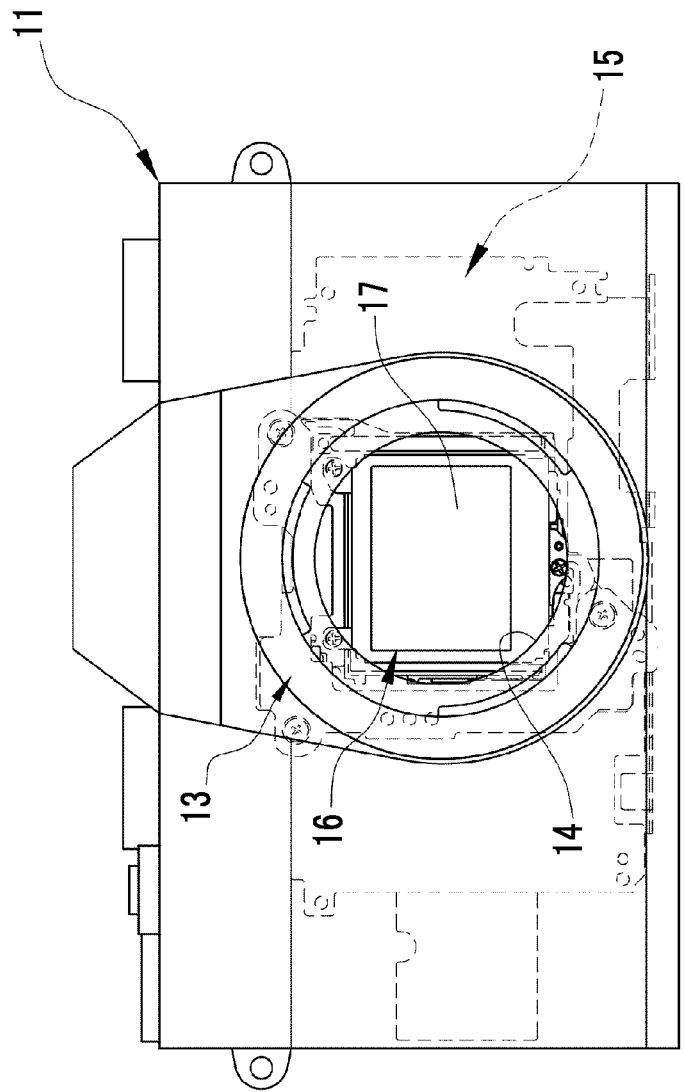
FIG. 2 is a front view of the imaging device.

As shown in FIG. 1, a digital camera 10 comprises a camera body 11 and an interchangeable imaging lens 12. As shown in FIG. 2, a lens mount 13 is provided on a front surface of the camera body 11. The lens mount 13 includes a circular imaging aperture 14. The imaging lens 12 is attachably and detachably mounted on the lens mount 13. The digital camera 10 is an example of an imaging device according to an embodiment of the present invention.

A vibration isolator 15 is built in the camera body 11. The vibration isolator 15 is a unit that is used to correct the shake of subject light caused by vibration applied to the camera body 11. The vibration applied to the camera body 11 is a camera shake that is caused by a user who images a subject while holding the camera body 11, or the like.

An imaging element 16 is mounted on the vibration isolator 15. The imaging element 16 is, for example, a complementary metal oxide semiconductor (CMOS) image sensor, a charge coupled device (CCD) image sensor, an organic thin film imaging element, or the like. The imaging element 16 includes a rectangular imaging surface 17 that images a subject. The imaging surface 17 receives subject light that indicates the subject. As well known, pixels, which photoelectrically convert the received subject light and output electrical signals, are two-dimensionally arranged on the imaging surface 17. The entire imaging surface 17 is exposed to the outside through the imaging aperture 14.

Figure 4:
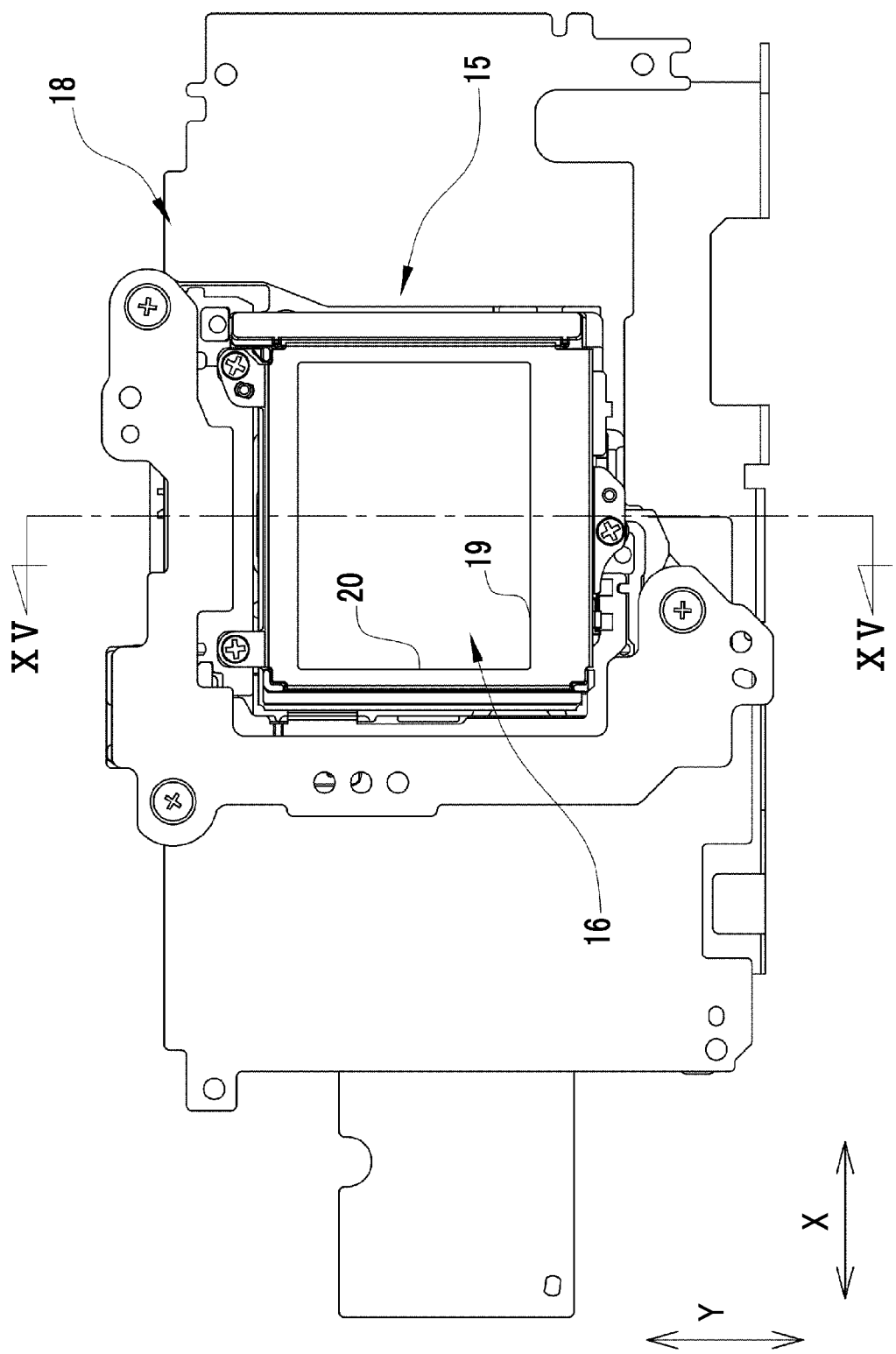
FIG. 4 is a front view of the vibration isolator.

As shown in FIGS. 3 and 4, the control board 18 is connected to the vibration isolator 15. Flexible printed boards 90 to 92 to be described later are used for connection between the vibration isolator 15 and the control board 18. The control board 18 is provided with a central processing unit 93 (CPU; see FIG. 9). The CPU 93 is a general-purpose processor that functions as various processing units by executing software (program). The CPU 93 controls the operation of each part of the digital camera 10 that includes the vibration isolator 15 and the imaging element 16.

The vibration isolator 15 moves the imaging element 16 under the control of the CPU 93 provided on the control board 18. In more detail, in a direction in which a shake is canceled by a distance that is required to cancel a shake, the vibration isolator 15 moves the imaging element 16 in an X-axis direction parallel to a side 19 of the imaging surface 17 of the imaging element 16 and a Y-axis direction orthogonal to the side 19, that is, parallel to a side 20 intersecting the side 19 at an angle of 90° and rotates the imaging element 16 about a Z-axis direction orthogonal to the X-axis direction and the Y-axis direction. The word "orthogonal" includes not only the meaning of "perfectly orthogonal" but also the meaning of "substantially orthogonal" including errors allowed in design and manufacturing. Further, in this specification, the word "parallel" includes not only the meaning of "perfectly parallel" but also the meaning of "substantially parallel" including errors allowed in design and manufacturing.

An optical axis OA is parallel to a Z axis. "Optical axis OA" refers to the optical axis of subject light that is incident on the imaging surface 17 through the imaging lens 12. The correction of a shake includes not only the meaning of the elimination of a shake but also a reduction in shake.

In the following description, a side corresponding to the side 19 is expressed as "lower" and a side opposite to the side 19 in the Y-axis direction is expressed as "upper". Further, a side corresponding to the side 20 is expressed as "left" and a side opposite to the side 20 in the X-axis direction is expressed as "right". Furthermore, a side from which subject light is incident on the imaging surface 17 in the Z-axis direction (that is, a side on which the imaging lens 12 is positioned) is expressed as "front" and a side opposite to the side from which subject light is incident is expressed as "rear".

Figure 5:
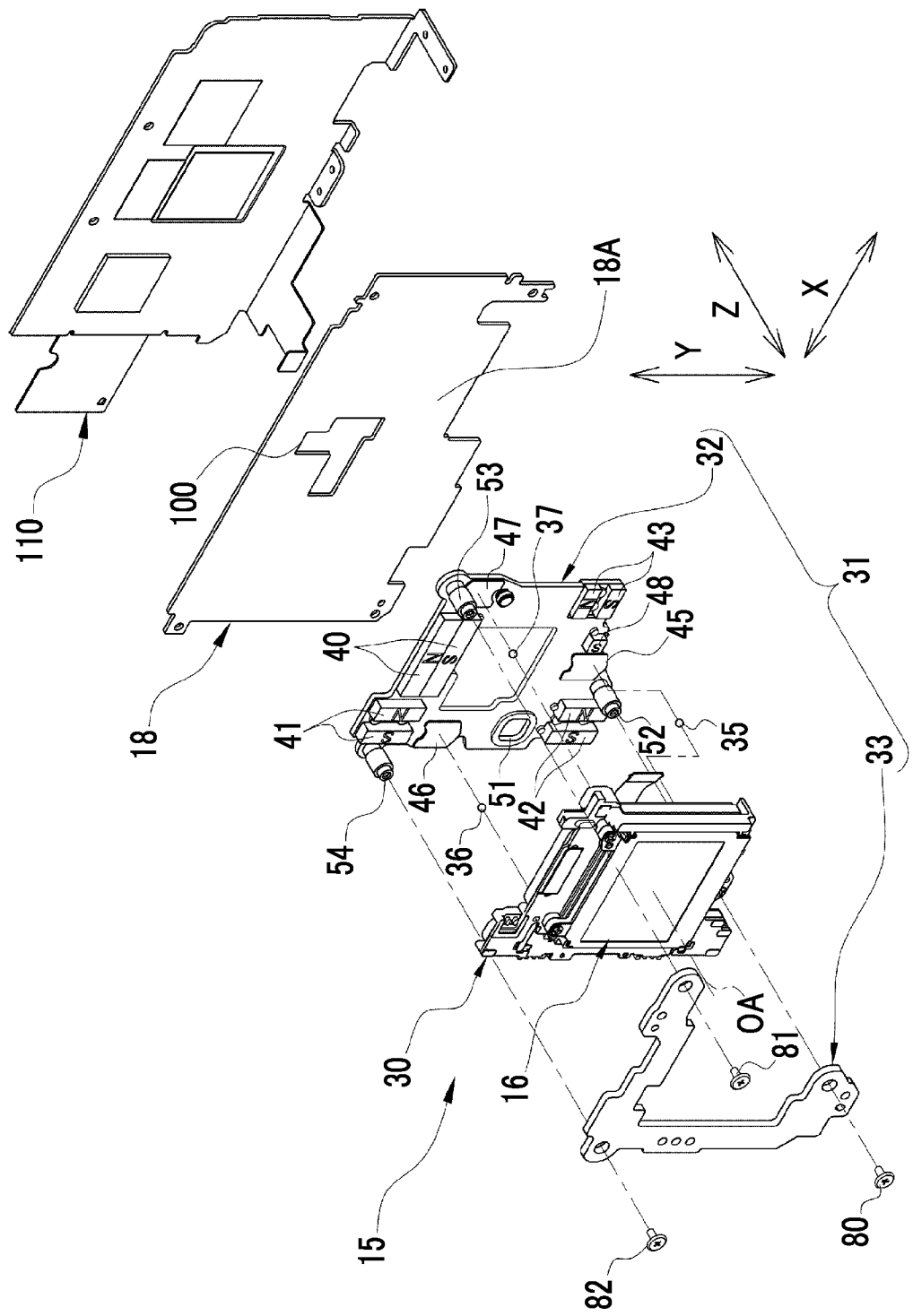
FIG. 5 is an exploded perspective view of the vibration isolator.

As shown in FIG. 5, the vibration isolator 15 comprises a holding unit 30 and a support unit 31. The support unit 31 comprises a fixing member 32 and a yoke 33. The holding unit 30 includes a circuit board 16A (see FIG. 15) on which the imaging element 16 is to be mounted, and is integrally provided with components, such as coils 60 to 62 and magnetic bodies 65 to 67 and a magnetic body 75, to be described later. The holding unit 30 is disposed between the fixing member 32 and the yoke 33 via a ball 35, a ball 36, and a ball 37 having the same size. The holding unit 30 can be moved with respect to the fixing member 32 and the yoke 33 in the X-axis direction and the Y-axis direction and be rotated about the Z-axis direction via the balls 35 to 37.

Figure 6:
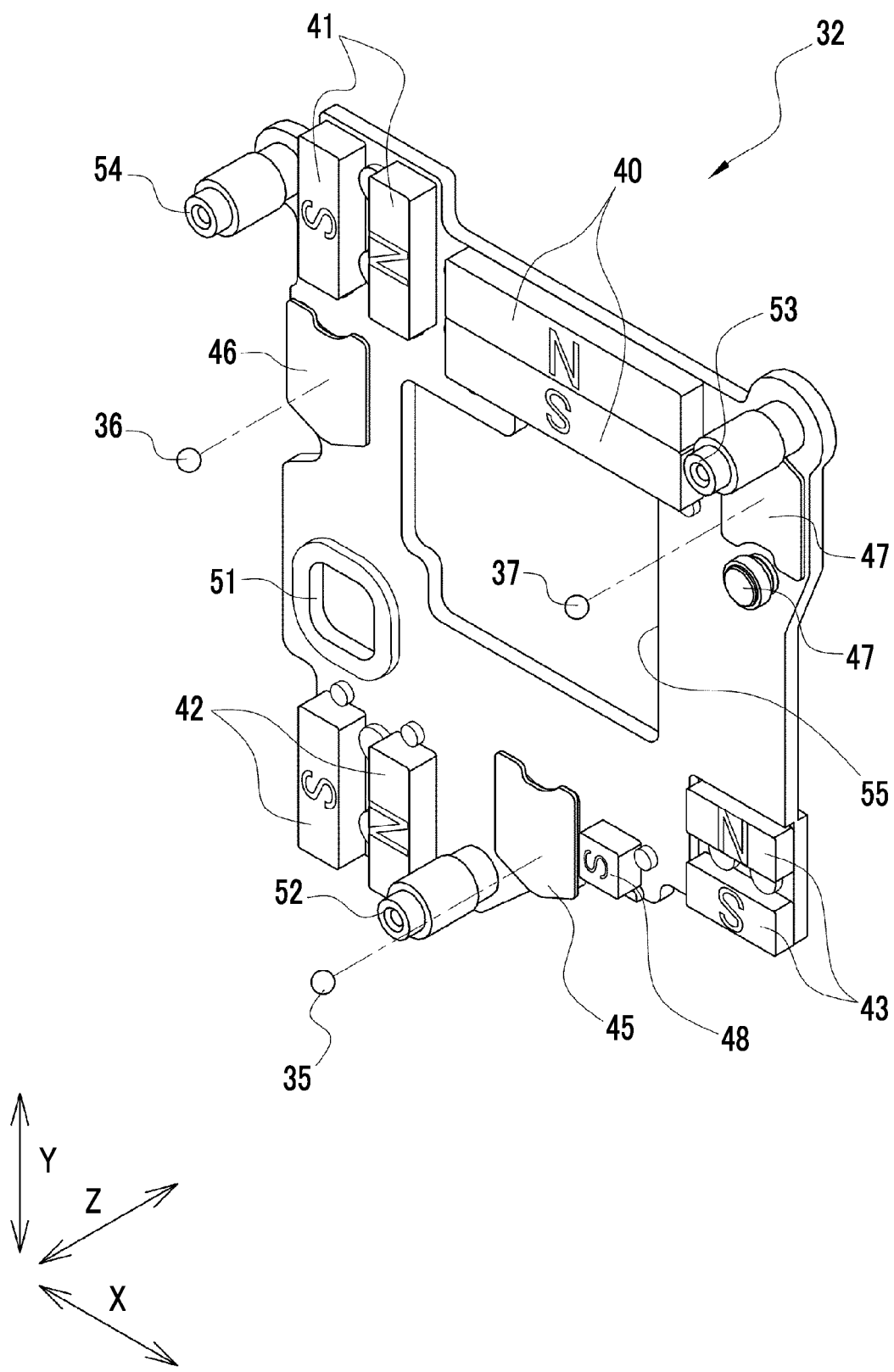
FIG. 6 is a perspective view of a fixing member.

As shown in FIG. 6, the fixing member 32 holds a magnet 40, a magnet 41, a magnet 42, and a magnet 43. The magnets 40 to 43 are mounted on a front surface of the fixing member 32 facing the holding unit 30. Each of the magnets 40 to 43 is a set of a sheet-like magnet of which an N pole faces the holding unit 30 and a sheet-like magnet of which an S pole faces the holding unit 30. The magnet 40 is disposed in the middle of an upper portion of the fixing member 32 such that a long side of the magnet 40 is parallel to the X-axis direction. The magnet 41 and the magnet 42 are arranged in the Y-axis direction. The magnet 41 is disposed at an upper left corner of the fixing member 32 such that a long side of the magnet 41 is parallel to the Y-axis direction. The magnet 42 is disposed at a lower left corner of the fixing member 32 such that a long side of the magnet 42 is parallel to the Y-axis direction. The magnet 43 is disposed at a lower right corner of the fixing member 32 such that a long side of the magnet 43 is parallel to the X-axis direction.

A plate 45, a plate 46, and a plate 47 are mounted on the front surface of the fixing member 32 in addition to the magnets 40 to 43. The plate 45 is disposed between the magnet 42 and the magnet 43 in the middle of a lower portion of the fixing member 32. The plate 46 is disposed below the magnet 41 at the upper left corner of the fixing member 32. The plate 47 is disposed adjacent to the right of the magnet 40 at an upper right corner of the fixing member 32. The plate 45 supports the rolling of the ball 35, the plate 46 supports the rolling of the ball 36, and the plate 47 supports the rolling of the ball 37.

A magnet 48 is mounted between the magnet 43 and the plate 45. The magnet 48 is disposed adjacent to the plate 45. "Adjacent" mentioned here means that a distance in an XY plane is, for example, 1 cm or less.

A square restriction opening 51, which restricts the movement range of the holding unit 30 in the XY plane, is formed in the fixing member 32. The restriction opening 51 is formed between the magnet 42 and the plate 46 at the lower left corner of the fixing member 32.

The fixing member 32 is provided with female screws 52 to 54 via spacers. The female screw 52 is provided in the middle of the lower portion of the fixing member 32, the female screw 53 is provided at the upper right corner of the fixing member 32, and the female screw 54 is provided at the upper left corner of the fixing member 32. A through-hole 55 into which flexible printed boards 90 to 92 to be described later are to be inserted is provided in a middle of the fixing member 32.

Figure 7:
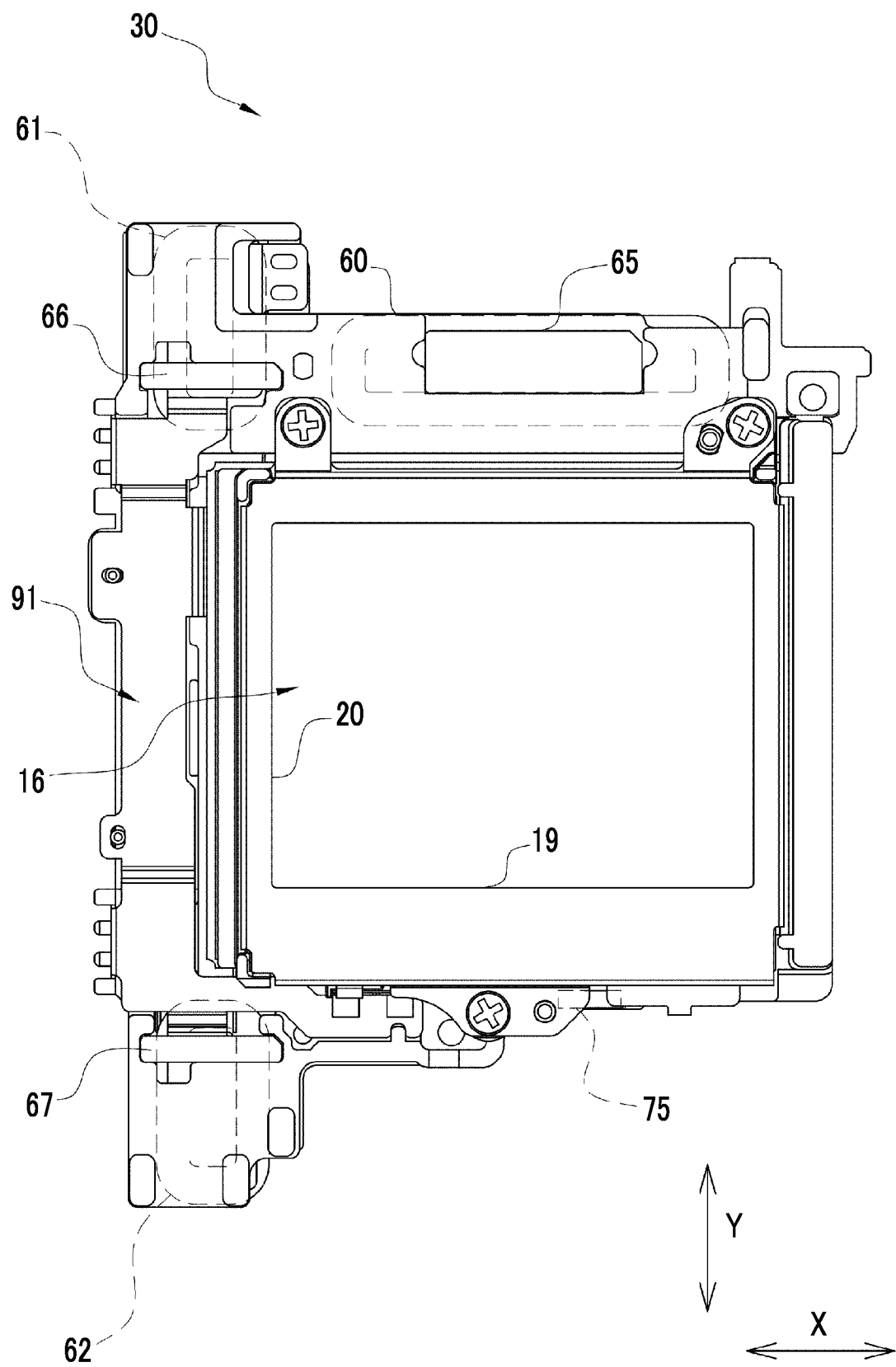
FIG. 7 is a front view of an imaging element and a holding unit.
Figure 8:
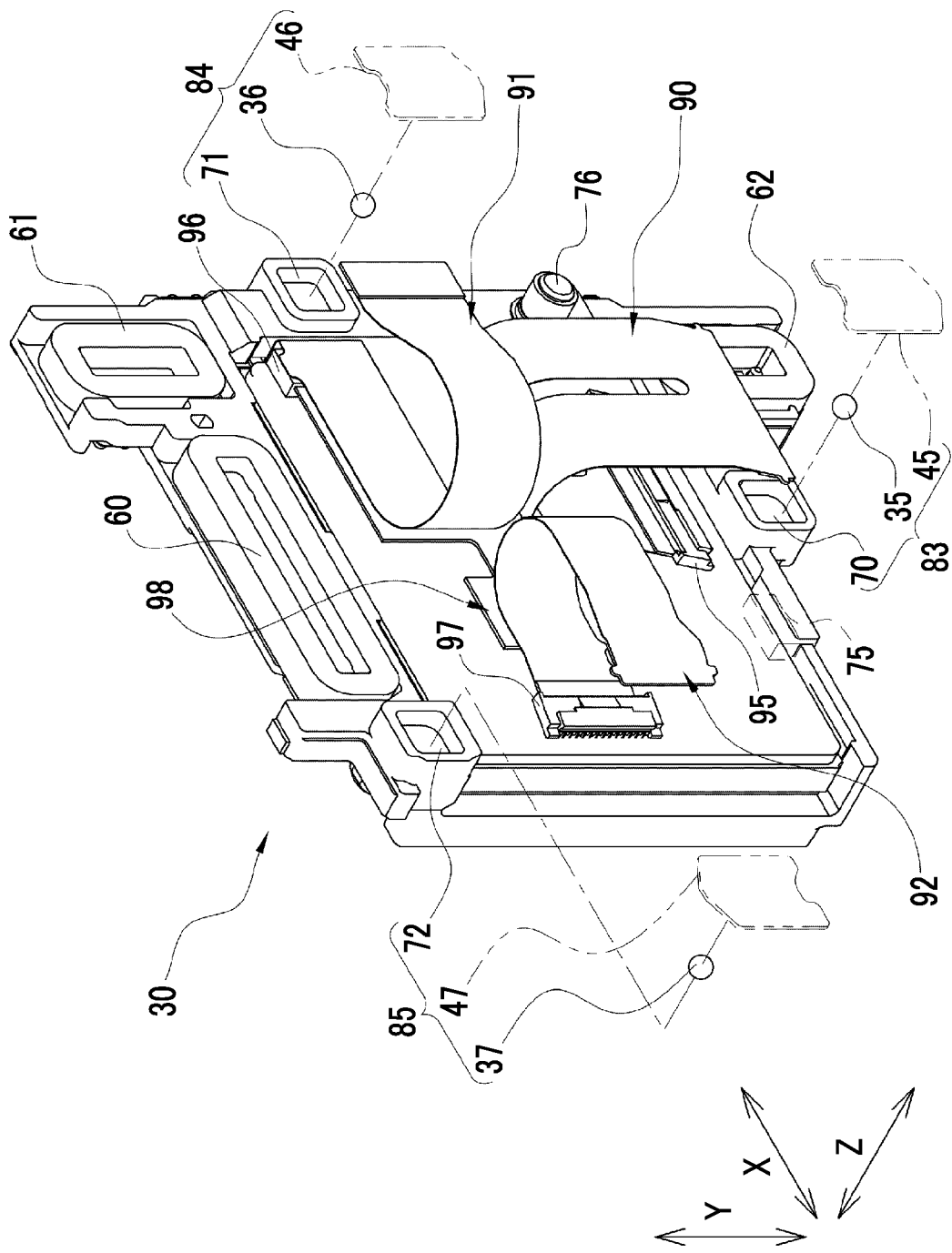
FIG. 8 is a rear perspective view of the holding unit.

As shown in FIGS. 7 and 8, the holding unit 30 holds the imaging element 16 and holds the coils 60 to 62. The imaging element 16 is disposed in a middle portion of the holding unit 30. The coil 60 is disposed at a position facing the magnet 40 in the Z-axis direction in the middle of an upper portion of the holding unit 30. The coil 61 is disposed at a position facing the magnet 41 in the Z-axis direction at an upper left corner of the holding unit 30. The coil 62 is disposed at a position facing the magnet 42 in the Z-axis direction at a lower left corner of the holding unit 30. The coil 60 is disposed such that a long side of the coil 60 is parallel to the X-axis direction. The coil 61 and the coil 62 are arranged in the Y-axis direction. Each of the coil 61 and the coil 62 is disposed such that a long side of each of the coil 61 and the coil 62 is parallel to the Y-axis direction.

Magnetic bodies 65 to 67 are mounted on a front surface of the holding unit 30 facing the yoke 33. The magnetic bodies 65 to 67 are, for example, thin plate pieces made of iron.

Since the coil 60 is disposed at a position facing the magnet 40 in the Z-axis direction as described above, the magnetic body 65 is also disposed at a position facing the magnet 40 in the Z-axis direction. For this reason, the magnetic body 65 is attracted to the magnet 40. That is, the magnet 40 and the magnetic body 65 act as a magnetic spring.

Likewise, since the coil 61 is disposed at a position facing the magnet 41 in the Z-axis direction as described above, the magnetic body 66 is also disposed at a position facing the magnet 41 in the Z-axis direction. For this reason, the magnetic body 66 is attracted to the magnet 41. That is, the magnet 41 and the magnetic body 66 also act as a magnetic spring. Further, since the coil 62 is disposed at a position facing the magnet 42 in the Z-axis direction as described above, the magnetic body 67 is also disposed at a position facing the magnet 42 in the Z-axis direction. For this reason, the magnetic body 67 is attracted to the magnet 42. That is, the magnet 42 and the magnetic body 67 also act as a magnetic spring.

Recessed portions 70 to 72 are formed on a rear surface of the holding unit 30 facing the fixing member 32. The recessed portion 70 is disposed at a position facing the plate 45 in the Z-axis direction in the middle of a lower portion of the holding unit 30. The recessed portion 71 is disposed at a position facing the plate 46 in the Z-axis direction at the upper left corner of the holding unit 30. The recessed portion 72 is disposed at a position facing the plate 47 in the Z-axis direction at an upper right corner of the holding unit 30. The recessed portion 70 houses the ball 35 such that the ball 35 can roll, the recessed portion 71 houses the ball 36 such that the ball 36 can roll, and the recessed portion 72 houses the ball 37 such that the ball 37 can roll. The sizes of the recessed portions 70 to 72, which are viewed in a plan view in the Z-axis direction, are larger than the diameters of the balls 35 to 37, respectively. Further, the depths of the recessed portions 70 to 72 in the Z-axis direction are smaller than the diameters of the balls 35 to 37, respectively.

The magnetic body 75 is mounted on a portion of the holding unit 30 facing the magnet 48 in the Z-axis direction. In a case where the magnetic body 75 and the magnet 48 are viewed in a plan view in the Z-axis direction, the magnetic body 75 and the magnet 48 are disposed at positions facing the magnetic bodies 65 to 67 with the imaging element 16 interposed therebetween. In other words, the magnet 48 is disposed in a middle portion of a diagonal region with respect to a substantially L-shaped region, which are parallel to the X-axis direction and the Y-axis direction and in which the magnetic bodies 65 to 67 are disposed, with the imaging element 16 interposed therebetween.

The magnetic body 75 is disposed at a position facing the magnet 48 in the Z-axis direction as described above. For this reason, the magnetic body 75 is attracted to the magnet 48. That is, the magnet 48 and the magnetic body 75 also act as a magnetic spring.

A columnar protrusion 76, which protrudes toward the fixing member 32, is provided on the rear surface of the holding unit 30 at a position facing the restriction opening 51 in the Z-axis direction. The protrusion 76 is inserted into the restriction opening 51. For this reason, the protrusion 76 acts as a restriction pin that restricts the movement of the holding unit 30 in the XY plane.

The yoke 33 is, for example, a magnetic body such as a thin plate made of iron, and has a substantially L-shape following the arrangement of the magnets 40 to 42 and the coils 60 to 62. The yoke 33 forms a magnetic circuit together with the magnets 40 to 42, and increases magnetic flux that is received by the coils 60 to 62.

Male screws 80 to 82 (see FIG. 5) are mounted on the yoke 33. The male screws 80 to 82 are fastened and fixed to the female screws 52 to 54 of the fixing member 32. Accordingly, the holding unit 30 is disposed between the fixing member 32 and the yoke 33 and the fixing member 32 and the yoke 33 are fixed to each other.

As shown in FIG. 8, the vibration isolator 15 comprises sliding mechanisms 83 to 85. The sliding mechanism 83 includes the ball 35, the plate 45, and the recessed portion 70. The sliding mechanism 84 includes the ball 36, the plate 46, and the recessed portion 71. Further, the sliding mechanism 85 includes the ball 37, the plate 47, and the recessed portion 72. The sliding mechanisms 83 to 85 allow the holding unit 30 to move with respect to the fixing member 32.

The sliding mechanisms 83 to 85, which are disposed at three points, allow the holding unit 30 of the vibration isolator 15 to stably move with respect to the fixing member 32 and the yoke 33. The holding unit 30 holds the imaging element 16. For this reason, the imaging element 16 is also moved with the movement of the holding unit 30. Under the control of the CPU 93 provided on the control board 18, the holding unit 30 is moved in a direction in which a shake is canceled by a distance that is required to cancel a shake.

Figure 9:
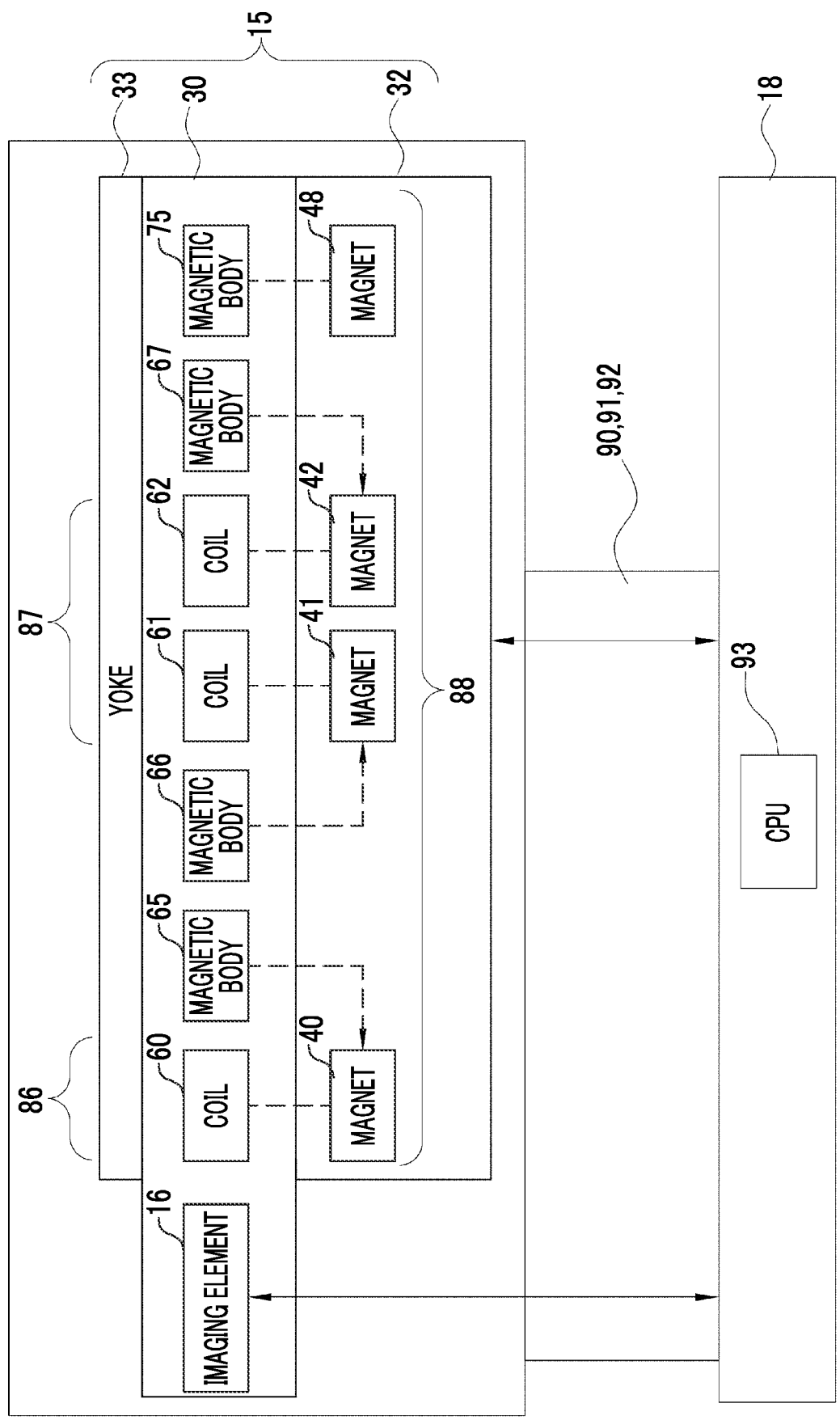
FIG. 9 is a block diagram showing a schematic configuration of a digital camera.

As shown in FIG. 9, the vibration isolator 15 comprises a pair of voice coil motors (VCMs). A pair of VCMs of the present embodiment is a pair formed of a first VCM 86 and a second VCM 87, and corresponds to a drive unit of claims. The first VCM 86 comprises a pair formed of the magnet 40 and the coil 60 and the yoke 33, and generates power that is used to move the holding unit 30 in the Y-axis direction. On the other hand, the second VCM 87 comprises a pair formed of the magnet 41 and the coil 61, a pair formed of the magnet 42 and the coil 62, and the yoke 33, and generates power that is used to move the holding unit 30 in the X-axis direction.

The first VCM 86 and the second VCM 87 drive the holding unit 30 in the XY plane perpendicular to the optical axis OA. More specifically, the first VCM 86 generates power that is used to move the holding unit 30 in the Y-axis direction with a magnetic force of the magnet 40 and a current flowing through the coil 60. Further, the second VCM 87 generates power that is used to move the holding unit 30 in the X-axis direction with a magnetic force of the magnet 41, a current flowing through the coil 61, a magnetic force of the magnet 42, and a current flowing through the coil 62.

The holding unit 30 includes three position detection sensors to detect a position and a rotational posture. Specifically, hall elements (not shown) are disposed at positions facing the magnets 41 to 43 in the Z-axis direction and detect a position using a magnetic field generated by the magnets 41 to 43. The hall elements are mounted on the flexible printed board 91 and the circuit board 16A.

The vibration isolator 15 comprises a magnetic force-applying mechanism 88. The magnetic force-applying mechanism 88 includes the magnets 40 to 42, the magnet 48, the magnetic bodies 65 to 67, and the magnetic body 75. The magnetic force-applying mechanism 88 applies a magnetic force that attracts the holding unit 30 to the fixing member 32 in the Z-axis direction. The holding unit 30 is biased to the fixing member 32 by this magnetic force, so that the rattling of the fixing member 32 in the Z-axis direction is eliminated.

The position of the holding unit 30, which is disposed between the fixing member 32 and the yoke 33 and is mounted on the support unit 31, in the Z-axis direction is restricted by the magnetic force-applying mechanism 88 and the holding unit 30 is allowed to move by the sliding mechanisms 83 to 85 disposed at three points. That is, the support unit 31 supports the holding unit 30 such that the holding unit 30 is movable in a plane perpendicular to the optical axis OA.

As described above, the holding unit 30 is provided with the imaging element 16 and the coils 60 to 62. The imaging element 16 or the coils 60 to 62 are electrically connected to the control board 18 via the plurality of flexible printed boards 90 to 92. The flexible printed boards 90 to 92 correspond to a flexible board of claims. The control board 18 is provided with the CPU 93. The three flexible printed boards 90 to 92 are provided in the present embodiment, but the present invention is not limited thereto. One or two flexible printed boards may be provided or four or more flexible printed boards may be provided.

As shown in FIG. 8, first connector parts 95 and 97 and a fixing cushion part 96 are provided on the rear surface of the holding unit 30. The first connector parts 95 and 97 and the fixing cushion part 96 correspond to a first flexible board fixing part of claims. The first connector part 95 is provided near a lower end of the holding unit 30, the fixing cushion part 96 is provided near a left end of the holding unit 30, and the first connector part 97 is provided near a right end of the holding unit 30.

The first connector parts 95 and 97 are provided with slots to which one ends of the flexible printed boards 90 and 92 are fitted, terminals that are provided in the slots and are electrically connected to the wiring patterns of the flexible printed boards 90 and 92, and the like. The fixing cushion part 96 has a structure in which double-sided tapes are attached to two surfaces of a cushion made of, for example, a urethane material, and fixes the circuit board 16A and an intermediate portion of the flexible printed board 91.

Further, a second guide plate 98 is provided on the rear surface of the holding unit 30. The second guide plate 98 is a sheet formed of a flat plate-like member that is disposed parallel to the imaging surface 17. The second guide plate 98 is attached to a mounting component 99 (see FIG. 15) of the circuit board 16A of the imaging element 16 via a double-sided tape or the like, and a sheet made of a polyethylene terephthalate (PET) resin is used as the second guide plate 98. In order to prevent the complication of the drawing, some components, such as the mounting component of the circuit board 16A, are omitted in FIG. 8. The second guide plate 98 is in contact with the flexible printed boards 90 to 92 as described later.

Figure 10:
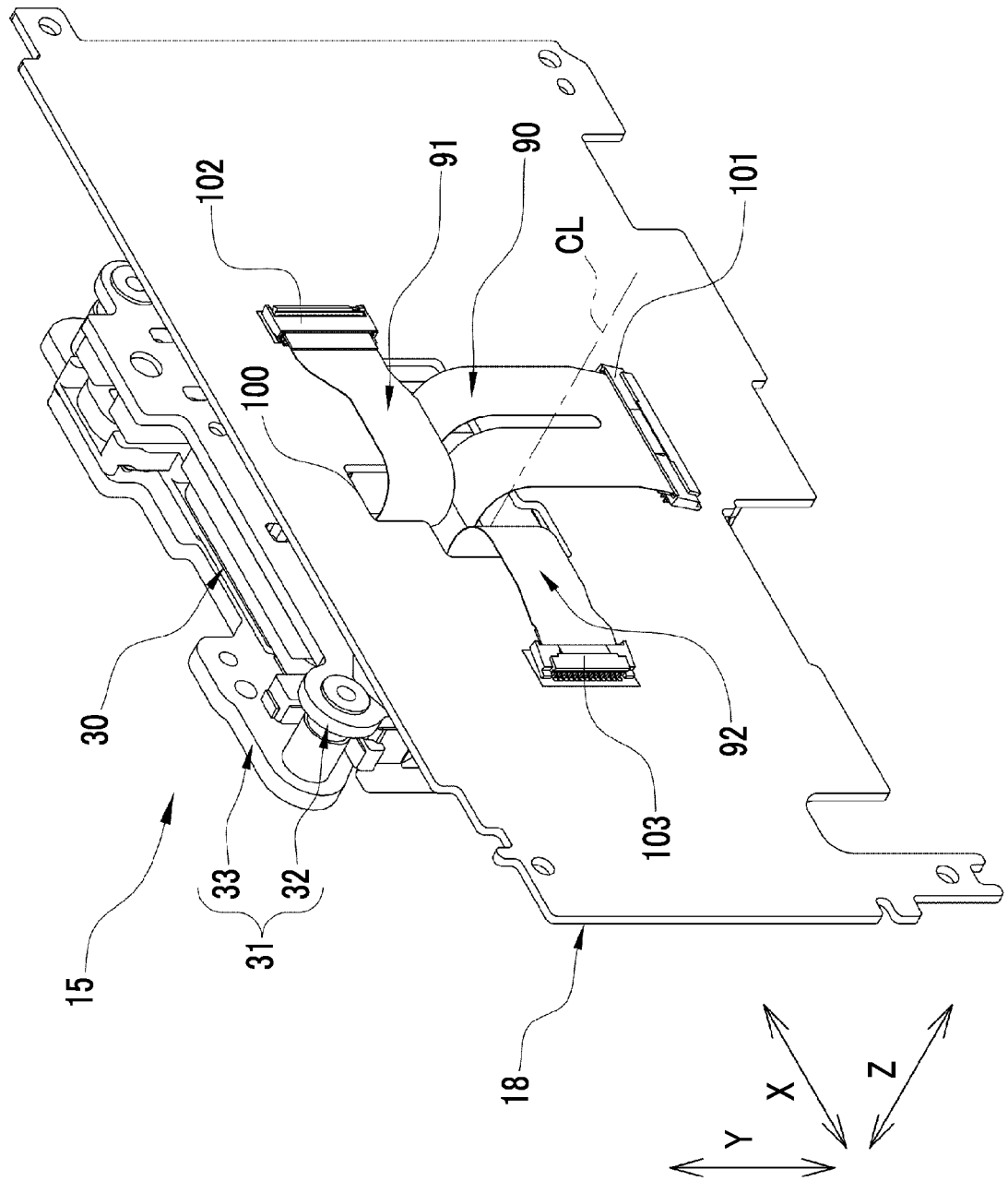
FIG. 10 is a rear perspective view of the vibration isolator and a control board.
Figure 11:
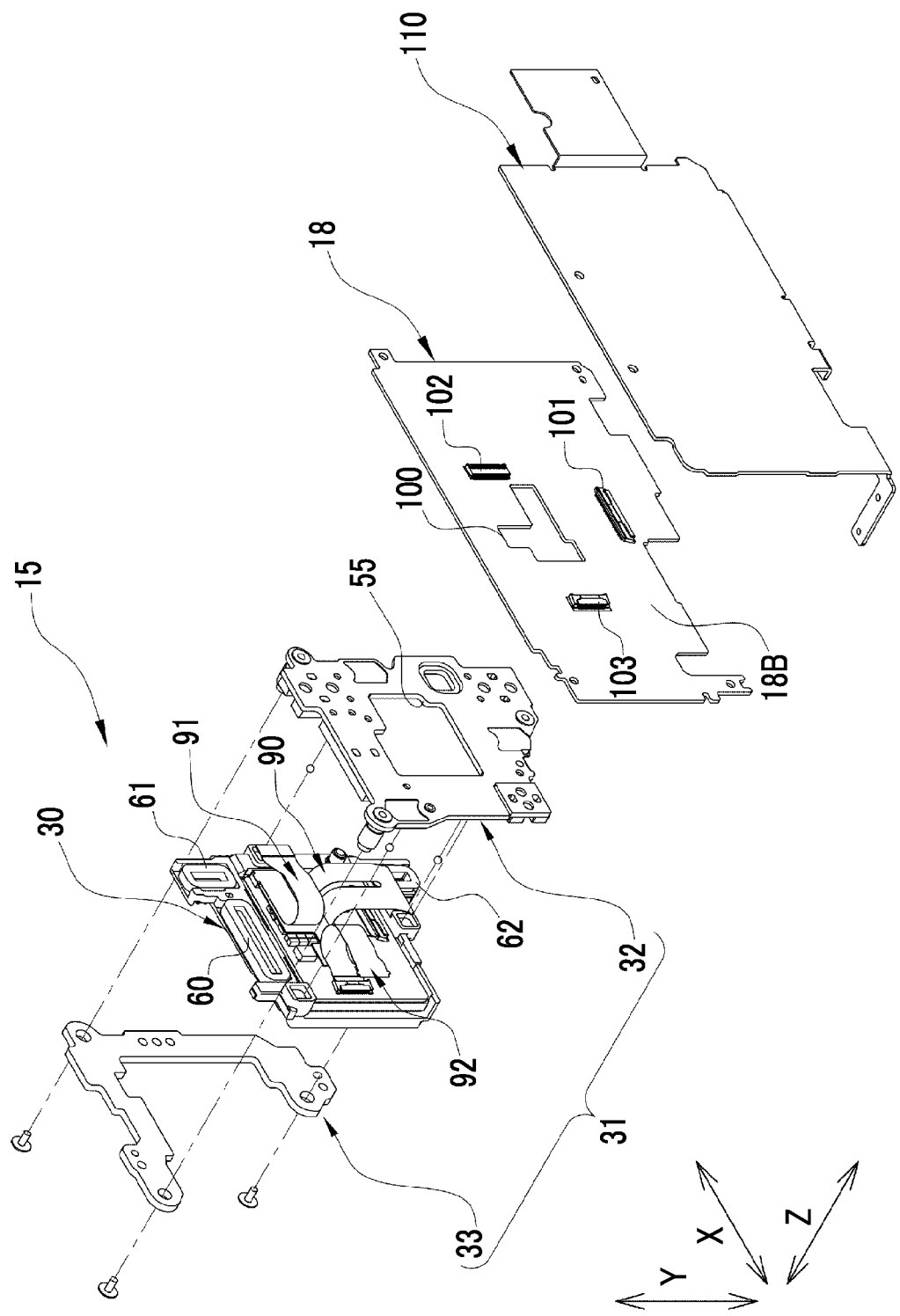
FIG. 11 is an exploded perspective view of the vibration isolator, the control board, and a first guide plate viewed from a rear side.

As shown in FIGS. 10 and 11, the control board 18 is positioned on the rear side of the vibration isolator 15. Further, a first guide plate 110 (see also FIG. 5) to be described later is provided on the rear side of the control board 18. The control board 18 and the first guide plate 110 are fixed to the camera body 11.

The control board 18 is provided with a through-hole 100 through which the flexible printed boards 90 to 92 are to pass and second connector parts 101 to 103. The second connector parts 101 to 103 correspond to a second flexible board fixing part of claims. The second connector parts 101 to 103 are disposed on a rear surface 18B opposite to a front surface 18A (a surface facing the imaging element 16; see FIG. 5) of the control board 18 facing the holding unit 30. The second connector parts 101 to 103 are disposed around the through-hole 100.

In a step of connecting the flexible printed boards 90 to 92 to the holding unit 30 and the control board 18 of the digital camera 10 according to the present embodiment, first, the flexible printed boards 90 and 92 are connected to the first connector parts 95 and 97. Specifically, one end of the flexible printed board 90 is connected to the first connector part 95 and one end of the flexible printed board 92 is connected to the first connector part 97.

For example, the flexible printed board 90 is electrically connected to the imaging element 16 by being connected to the first connector part 95 and the flexible printed board 92 is electrically connected to the circuit board 16A of the imaging element 16 and the like by being connected to the first connector part 97, so that power is supplied. The flexible printed board 91 is electrically connected to the coils 60 to 62 and the hall elements (not shown) via solder portions.

The flexible printed boards 90 to 92, which are fixed by the first connector parts 95 and 97 and the fixing cushion part 96, extend in a center direction (a direction toward a center CL) of the imaging element 16 in the XY plane parallel to the imaging surface 17. Specifically, a portion, which extends from the first connector part 95, of the flexible printed board 90 connected to the first connector part 95 is disposed parallel to the Y-axis direction, a portion, which extends from the fixing cushion part 96, of the flexible printed board 91 fixed by the fixing cushion part 96 is disposed parallel to the X-axis direction, and a portion, which extends from the first connector part 97, of the flexible printed board 92 connected to the first connector part 97 is disposed parallel to the X-axis direction. The center CL of the imaging element 16 mentioned here means the center of the imaging surface 17.

Next, the other ends of the flexible printed boards 90 to 92 are connected to the second connector parts 101 to 103, respectively. As described above, the flexible printed boards 90 to 92 of which one ends are connected to the first connector parts 95 and 97 and the fixing cushion part 96, respectively, pass through the through-hole 55 of the fixing member 32 and the through-hole 100 of the control board 18 and protrudes toward the rear surface 18B of the control board 18. Further, the flexible printed boards 90 to 92 passing through the through-hole 100 protrude toward the rear surface 18B in a state where the flexible printed boards 90 to 92 are bent at an angle of 180°.

Figure 12:
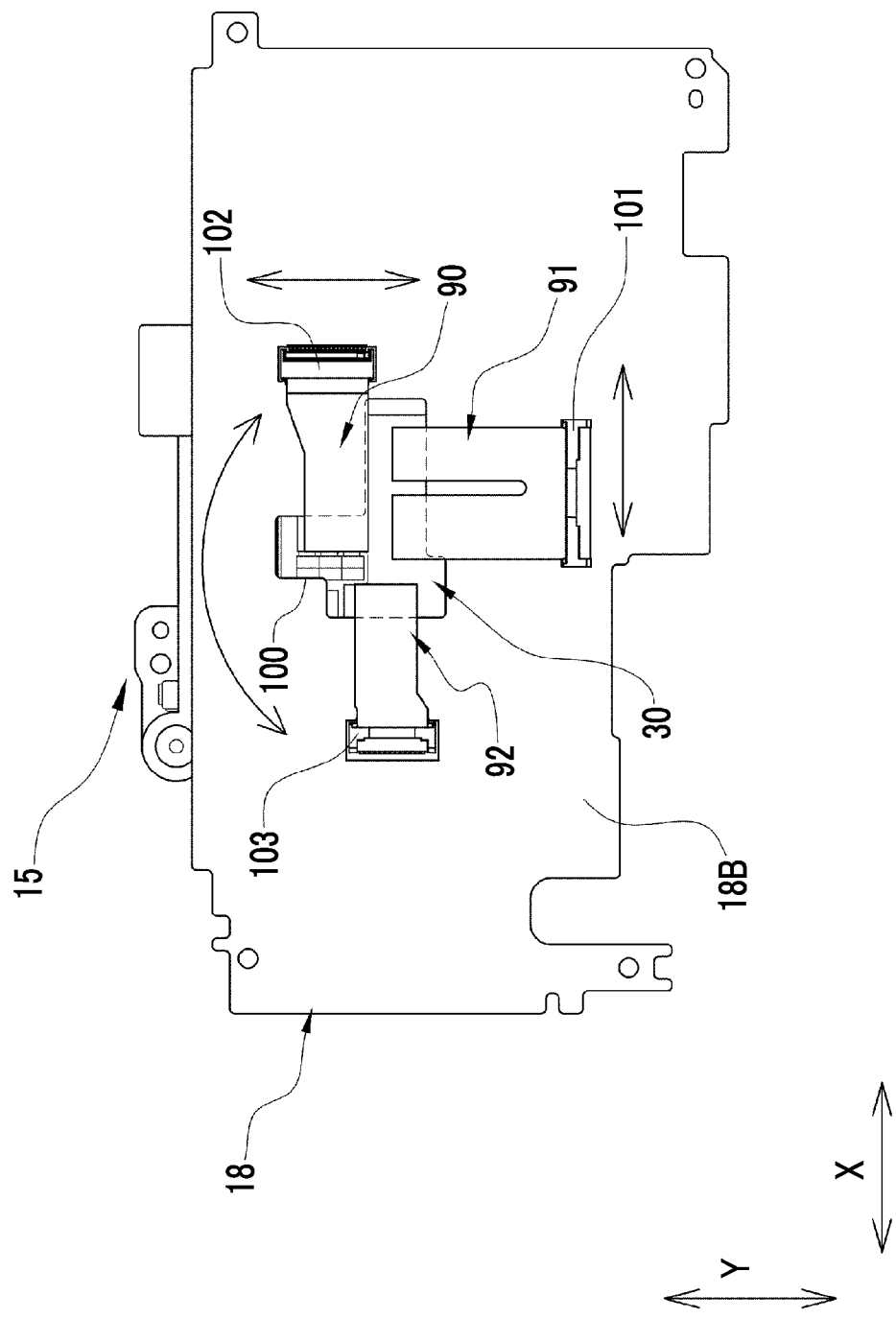
FIG. 12 is a rear view of the vibration isolator and the control board.

As shown in FIG. 12, after passing through the through-hole 100 of the control board 18, the other end of the flexible printed board 90 is connected to the second connector part 101, the other end of the flexible printed board 91 is connected to the second connector part 102, and the other end of the flexible printed board 92 is connected to the second connector part 103. As described above, the imaging element 16 or the coils 60 to 62 are electrically connected to the control board 18 via the flexible printed boards 90 to 92.

Figure 13:
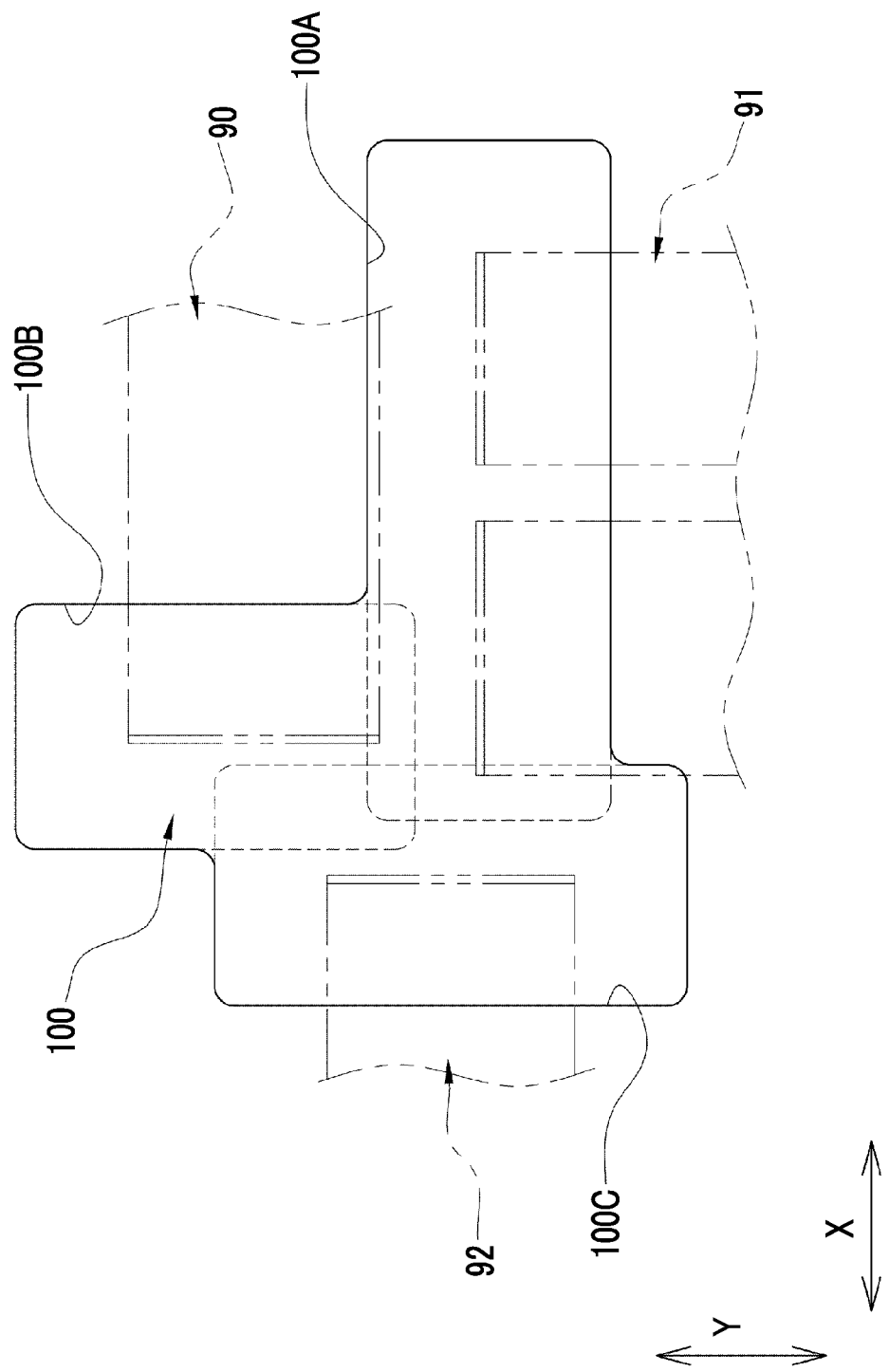
FIG. 13 is a diagram illustrating a through-hole of the control board.

As shown in FIG. 13, the through-hole 100 has a shape in which at least two substantially rectangular shapes overlap each other and has a shape in which three substantially rectangular shapes overlap each other in the present embodiment. That is, the through-hole 100 has a shape in which a substantially rectangular region 100A in which the flexible printed board 90 is moved, a substantially rectangular region 100B in which the flexible printed board 91 is moved, and a substantially rectangular region 100C in which the flexible printed board 92 is moved overlap each other. Accordingly, spaces in which the flexible printed boards 90 to 92 are moved are concentrated on one point and a part of the regions 100A to 100C in which the respective flexible printed boards 90 to 92 are moved overlap each other, so that a space can be saved.

The first guide plate 110 is provided on a side of the control board 18 corresponding to the rear surface 18B and is in contact with the flexible printed boards 90 to 92. As described above, the flexible printed boards 90 to 92 are also in contact with the second guide plate 98 positioned on the imaging element 16. The first guide plate 110 corresponds to a first plate of claims and the second guide plate 98 corresponds to a second plate of claims.

Figure 14:
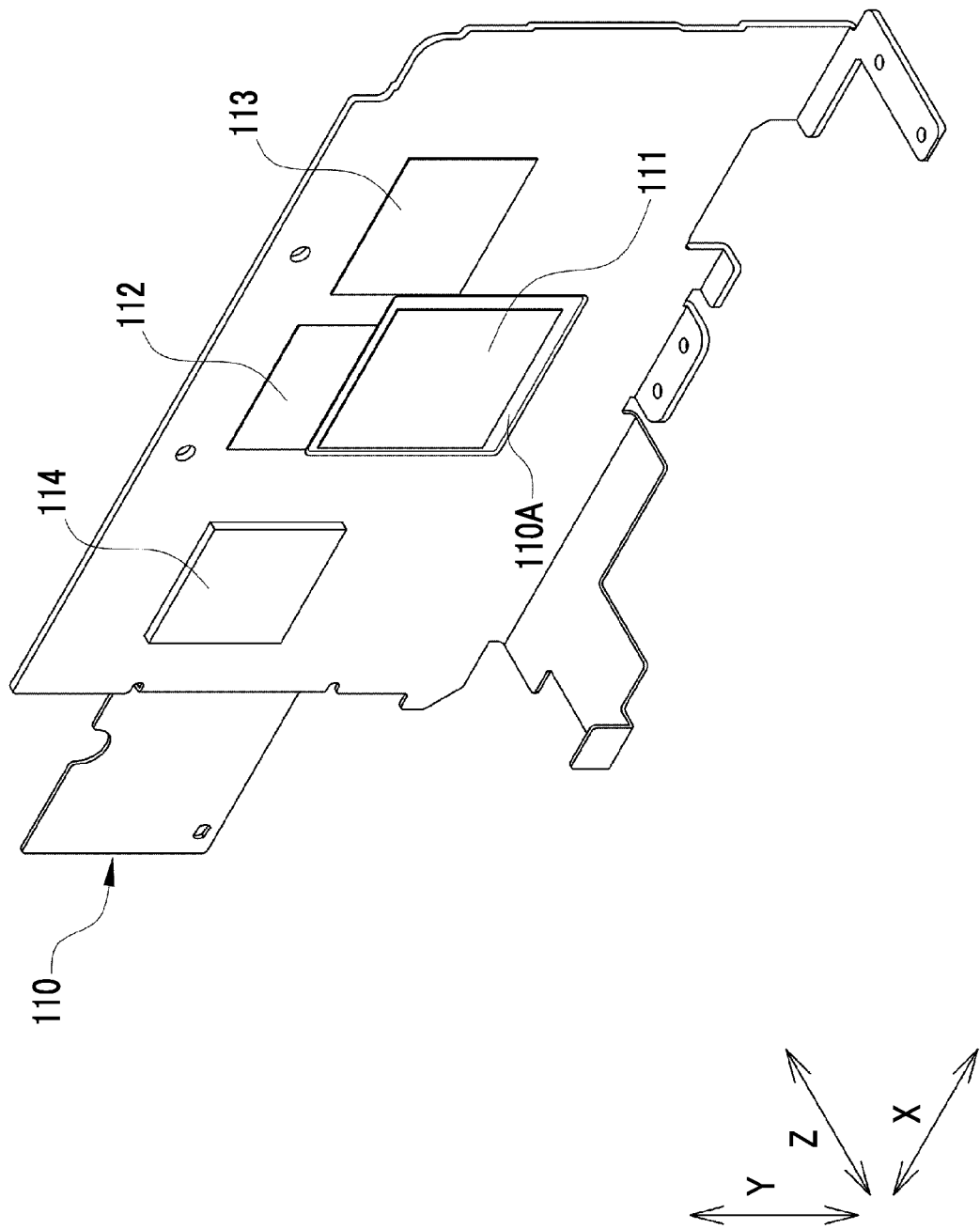
FIG. 14 is a perspective view of the first guide plate.

As shown in FIG. 14, the first guide plate 110 is provided with fluorine tapes 111 to 113 serving as friction reducing parts and a thermally conductive sheet 114. The fluorine tapes 111 to 113 are attached to the first guide plate 110 at positions where the flexible printed boards 90 to 92 are in contact with the first guide plate 110. Accordingly, friction against the flexible printed boards 90 to 92 can be reduced and drive loads in a case where the first VCM 86 and the second VCM 87 are driven can be reduced. The friction reducing part is not limited to the fluorine tape and may be any material having a low friction coefficient with respect to the flexible printed boards 90 to 92. Further, not only the first guide plate 110 but also the second guide plate 98 may be provided with friction reducing parts at positions where the flexible printed boards 90 to 92 are in contact with the second guide plate 98.

The thermally conductive sheet 114 is made of, for example, silicone rubber and is provided on the first guide plate 110 at positions where the control board 18 is in contact with the first guide plate 110, specifically, at positions where mounting components, such as the CPU 93, are in contact with the first guide plate 110. The thermally conductive sheet 114 conducts heat, which is transferred from the control board 18, to the first guide plate 110. At least a part of the first guide plate 110 is formed of a plate made of a material having a heat dissipation effect, for example, copper. Accordingly, heat, which is transferred from the control board 18 and conducted via the thermally conductive sheet 114, is likely to be dissipated.

Figure 15:
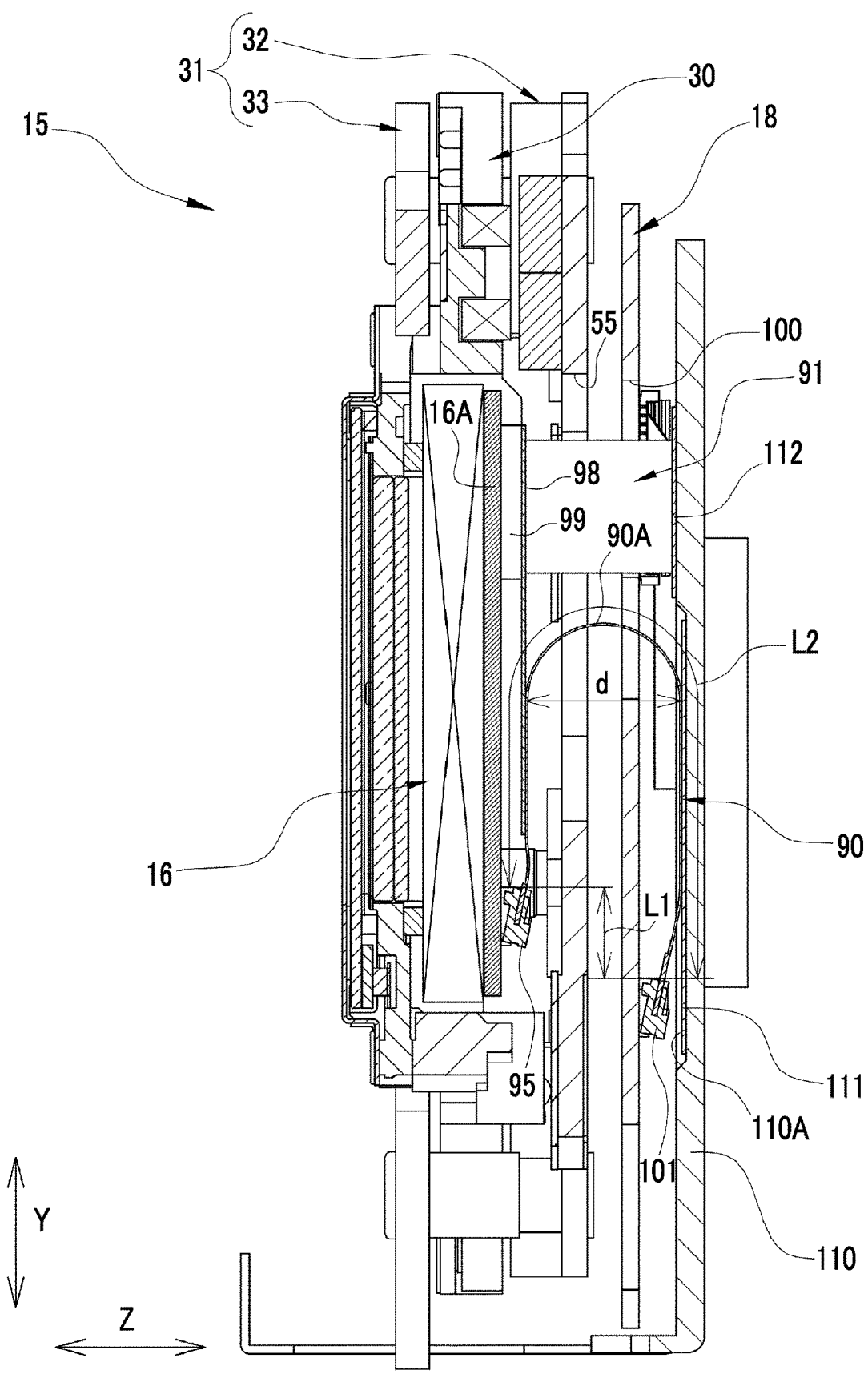
FIG. 15 is a cross-sectional view of main portions of the vibration isolator, the control board, and the first guide plate taken along line XV-XV of FIG. 4.

FIG. 15 is a cross-sectional view of main portions taken at a position where the flexible printed board 90 is in contact with the first guide plate 110 and the second guide plate 98. The flexible printed board 90 is interposed between the first guide plate 110 and the second guide plate 98, and is connected to the first connector part 95 and the second connector part 101 in a state where the flexible printed board 90 is bent at an angle of 180°. That is, the flexible printed board 90 includes a semicircular bent portion 90A.

In a case where a distance between the first connector part 95 and the second connector part 101 in a longitudinal direction of the flexible printed board 90, that is, the Y-axis direction is denoted by L1, a diameter of the bent portion 90A is denoted by d, and a length of the flexible printed board 90 in the Y-axis direction is denoted by L2, a relationship of "$L2 > L1 + \pi d/2$" is satisfied. Accordingly, since the flexible printed board 90 is disposed such that a linear portion is long in the Y-axis direction, the twist or the like of the flexible printed board 90 is less likely to occur. That is, drive loads in a case where the first VCM 86 and the second VCM 87 are driven can be reduced. The length L2 is a length of the flexible printed board 90 except for portions of the flexible printed board 90 connected to the first connector part 95 and the second connector part 101 (portions of the flexible printed board 90 inserted into the first connector part 95 and the second connector part 101). The distance L1 varies depending on the position of the holding unit 30 but a relationship of "$L2 > L1 + \pi d/2$" is satisfied in all the displacement regions, so that drive loads are always reduced.

A dimensional relationship between the flexible printed board 90 and the first and second connector parts 95 and 101 is shown in FIG. 15, but a dimensional relationship between the flexible printed board 91 and the fixing cushion part 96 and the second connector part 102 and a dimensional relationship between the flexible printed board 92 and the first and second connector parts 97 and 103 are also expressed in the same manner.

Further, the first guide plate 110 has different heights in the Z-axis direction for the flexible printed boards 90 to 92. That is, the first guide plate 110 has a stepped shape in which heights in the Z-axis direction differ at positions where the first guide plate 110 is in contact with the flexible printed boards 90 to 92.

As shown in FIG. 15, for example, the fluorine tape 111, which is in contact with the flexible printed board 90, is positioned inside a recessed portion 110A that is recessed from the periphery by one step. On the other hand, the fluorine tape 112, which is in contact with the flexible printed board 91, is positioned outside the recessed portion 110A. That is, the first guide plate 110 has different heights in the Z-axis direction at a position where the first guide plate 110 is in contact with the flexible printed board 90 and a position where the first guide plate 110 is in contact with the flexible printed board 91, and has a stepped shape between both the positions. Accordingly, the bending radii of the flexible printed boards 90 to 92 are changed, so that drive loads can be adjusted.

Connection between the other end of the flexible printed board 90 and the second connector part 101 will be described with reference to FIGS. 16A and 16B and FIGS. 17A and 17B. Not only connection between the flexible printed board 90 and the second connector part 101 but also connection between the flexible printed boards 91 and 92 and the second connector parts 102 and 103 has the same structure. Further, connection between the flexible printed boards 90 to 92 and the first connector parts 95 and 97 and the fixing cushion part 96 may also have the same structure as described above.

Figure 16A:
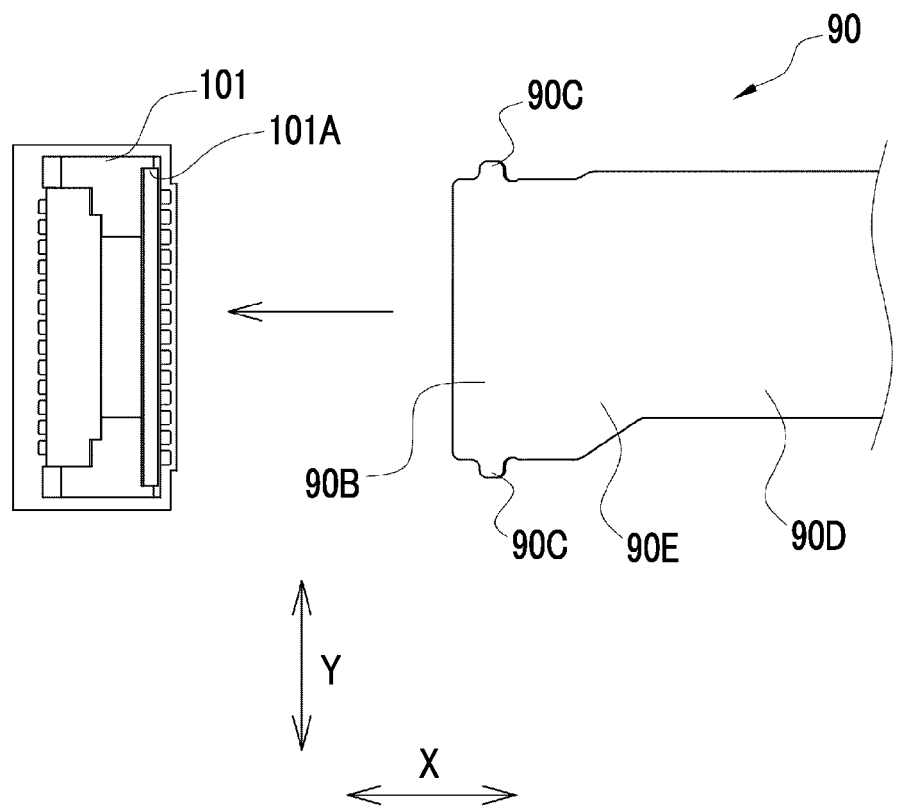
FIGS. 16A and 16B are rear views of a second connector part and the other end portion of the flexible printed board.

As shown in FIG. 16A, the other end of the flexible printed board 90 is provided with a fitting portion 90B and a pair of protruding portions 90C. The fitting portion 90B is formed to have a large thickness and is fitted to a slot 101A of the second connector part 101. The slot 101A is formed in the shape of a groove corresponding to the fitting portion 90B, and a terminal (not shown) is provided in the slot 101A. The protruding portions 90C protrude from both sides of the fitting portion 90B in a width direction, and are locked to recessed portions (not shown) formed in the slot 101A in a case where the fitting portion 90B is fitted to the slot 101A. Accordingly, the easy separation of the flexible printed board 90 from the second connector part 101 is prevented.

Figure 16B:
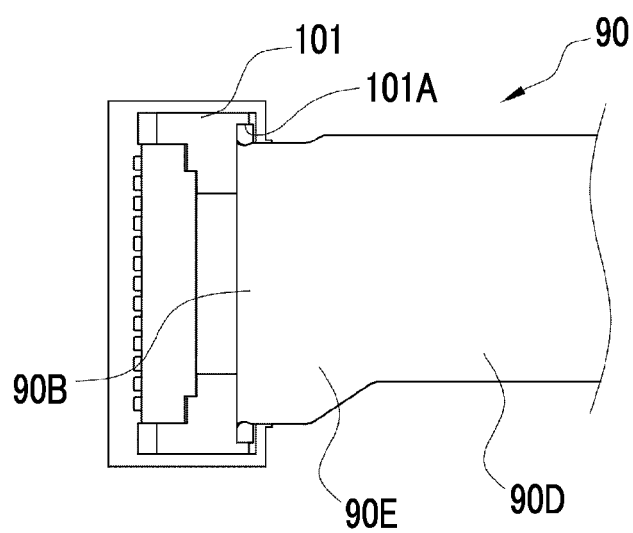

The flexible printed board 90 is disposed to extend in the X-axis direction as described above. Reference numeral 90D denotes a linear portion extending in the X-axis direction. The linear portion 90D and the second connector part 101 are disposed such that the positions of the linear portion 90D and the second connector part 101 are shifted from each other in the Y-axis direction. For this reason, a crank-shaped position absorption portion 90E is provided at a part of the fitting portion 90B or near the fitting portion 90B. As shown in FIG. 16B, since the position absorption portion 90E is provided, a distance by which the position of the linear portion 90D is shifted in the Y-axis direction can be absorbed and the second connector part 101 and the other end of the flexible printed board 90 can be reliably connected to each other. Accordingly, the degree of freedom in design for the disposition of the flexible printed board 90 is improved.

Figure 17A:
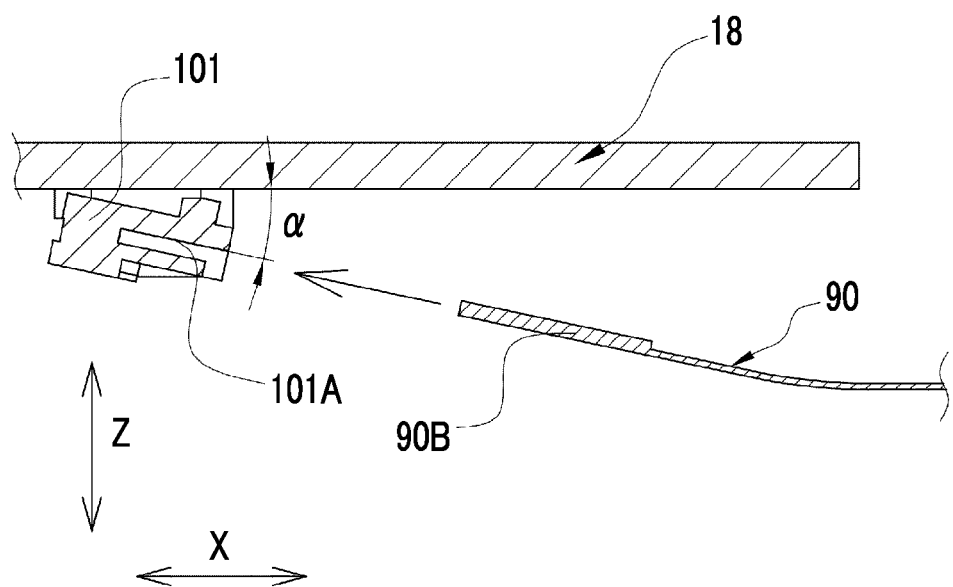
FIGS. 17A and 17B are cross-sectional views of main portions of the second connector part and the other end of the flexible printed board.
Figure 17B:
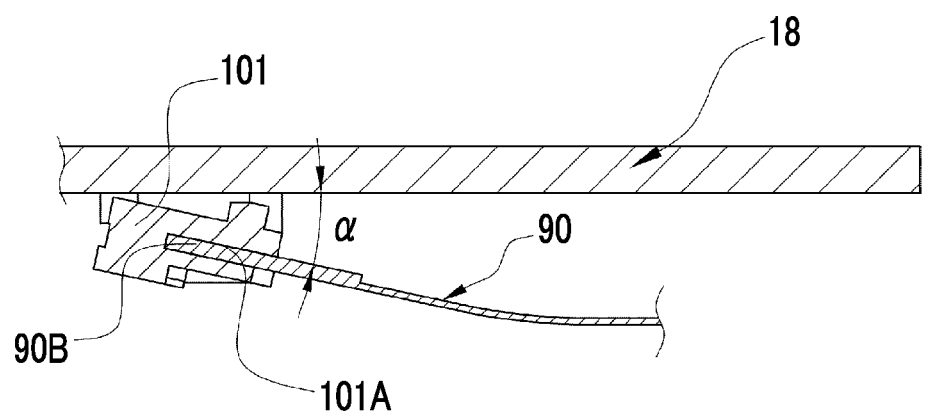

As shown in FIG. 17A, the second connector part 101 is provided in a direction oblique to the XY plane. That is, a direction in which the slot 101A of the second connector part 101 is disposed has an inclination of an angle α with respect to the XY plane. FIGS. 17A and 17B show a cross section that is orthogonal to the Y-axis direction and taken in the X-axis direction. In a case where the fitting portion 90B is fitted to the slot 101A and the flexible printed board 90 is connected to the second connector part 101 as shown in FIG. 17B, the other end of the flexible printed board 90 has an inclination of an angle α with respect to the XY plane. Due to this inclination, the flexible printed board 90 can avoid being in contact with the control board 18 and can be in reliable contact with the fluorine tape 111 attached to the first guide plate 110. As a result, drive loads can be stabilized.

Next, the action of the digital camera 10 according to the present embodiment will be described. In a case where vibration is generated due to camera shake or the like caused by a user holding the camera body 11, the CPU 93 takes a difference between a position of the holding unit 30 that is detected by the hall elements (not shown) and a target position of the holding unit 30 that is used for the correction of a shake, and performs a feedback control for driving the first VCM 86 and the second VCM 87 to eliminate the difference. In a case where the first VCM 86 and the second VCM 87 are driven, that is, the coils 60 to 62 are driven to correct a shake as shown in FIG. 12, the holding unit 30 is moved together with the imaging element 16 and receives drive loads from the flexible printed boards 90 to 92 connected to the holding unit 30.

Since the through-hole 100 is formed in the control board 18 and the imaging element 16 or the coils 60 to 62 are electrically connected to the control board 18 by the flexible printed boards 90 to 92 passing through the through-hole 100 as described above, large radii of the flexible printed boards 90 to 92 can be obtained and drive loads in a case where the first VCM 86 and the second VCM 87 are driven can be reduced. In a case where flexible printed boards pass outside the control board without passing a through-hole as in the imaging device in the related art, it is difficult to obtain large bending radii due to a small space around the control board or the size of the camera body is increased in a case where the bending radii are increased. In the present invention, due to the above-mentioned configuration, large bending radii of the flexible printed boards are obtained and a space is not required around the control board. Accordingly, the size of the camera body can be reduced. Further, since drive loads can be reduced, the size of the drive unit can be reduced. Even in this regard, the size of the camera body can be reduced.

Furthermore, portions, which extend from the first connector parts 95 and 97 and the fixing cushion part 96, of the flexible printed boards 90 to 92 connected to the first connector parts 95 and 97 and the fixing cushion part 96 extend in the center direction of the imaging element 16. Accordingly, linear portions of the flexible printed boards 90 to 92 can be disposed to be long. In a case where linear portions of the flexible printed boards are short as in the imaging device in the related art, the flexible printed boards are likely to be twisted and drive loads are increased. However, since the linear portions of the flexible printed boards 90 to 92 can be disposed to be long as in the above-mentioned configuration in the present invention, drive loads in a case where the first VCM 86 and the second VCM 87 are driven can be reduced.

Further, since the first guide plate 110 and the second guide plate 98 to be in contact with the flexible printed boards 90 to 92 are provided, the bending radii of the flexible printed boards 90 to 92 can be kept constant and the flexible printed boards 90 to 92 can be smoothly moved. As a result, drive loads can be reduced. In a case where the flexible printed boards are not guided as in the imaging device in the related art, the bending radii are changed at each position where the holding unit is moved, which causes drive loads to be unstable. However, since the bending radii can be kept constant in the present invention, drive loads can be kept to be equal to or smaller than a certain load. Furthermore, since the first guide plate 110 is provided with the fluorine tapes 111 to 113 serving as friction reducing parts, drive loads can be further reduced.

Further, the plurality of flexible printed boards 90 to 92 are provided, a portion, which extends from the first connector part 95, of one flexible printed board 90 is disposed parallel to the Y-axis direction, and the flexible printed board 91, which is another flexible printed board, is disposed parallel to the X-axis direction. Drive loads applied to the flexible printed boards in directions orthogonal to the extending directions of the flexible printed boards are increased. However, since the extending directions are dispersed in this way, a drive load applied in one direction can be reduced.

Second Embodiment

Figure 18:
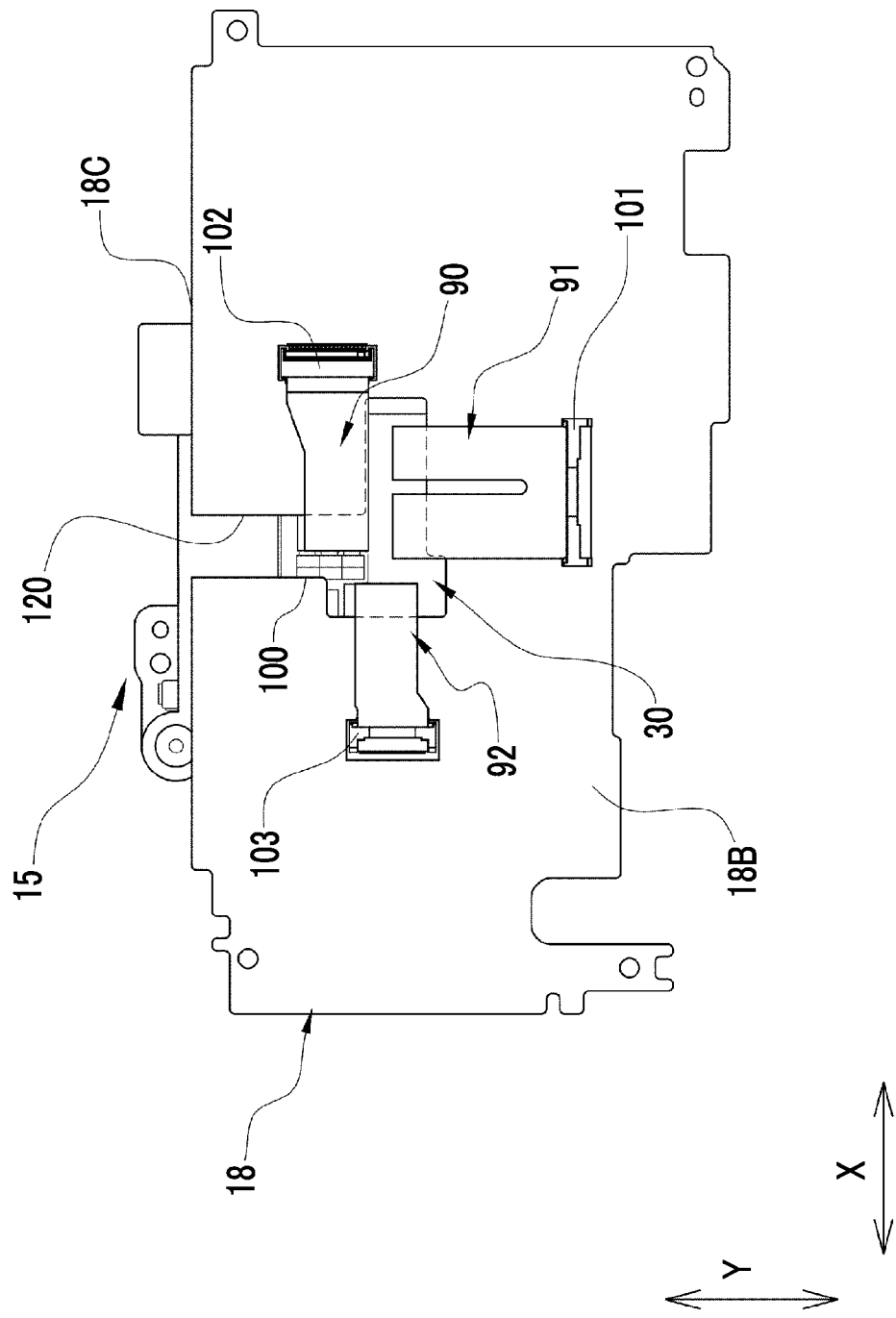
FIG. 18 is a rear view of a vibration isolator and a control board of a second embodiment.
Figure 19:
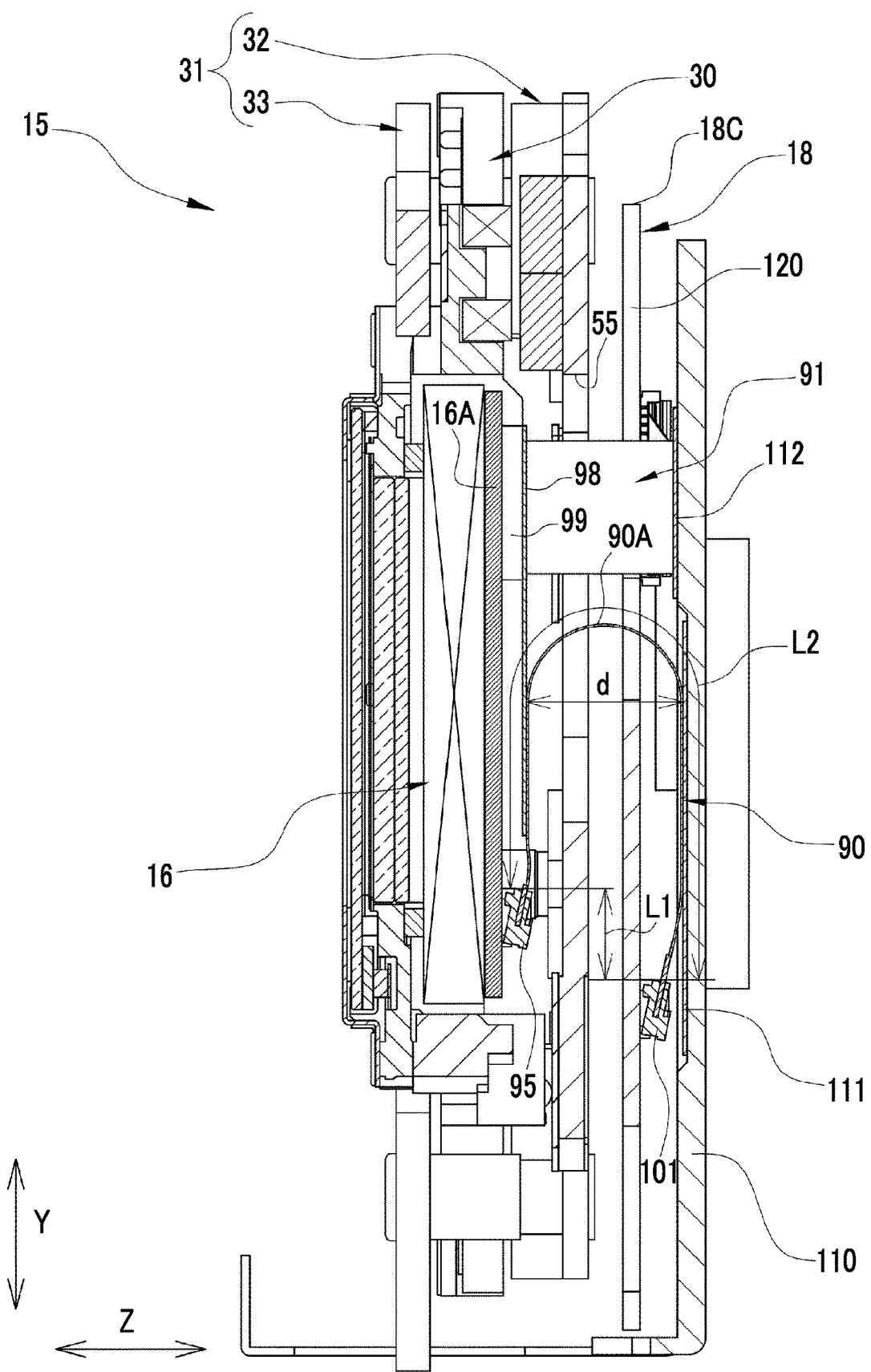
FIG. 19 is a cross-sectional view of main portions of the vibration isolator, the control board, and a first guide plate of the second embodiment.

The through-hole 100 is formed in the control board 18 as a relief portion through which the flexible printed boards 90 to 92 are to pass in the first embodiment, but the present invention is not limited thereto. As shown in FIGS. 18 and 19, a notch is formed in the control board 18 and the flexible printed boards 90 to 92 pass through the notch in a second embodiment to be described below. Since the configuration of the second embodiment is the same as the configuration of the first embodiment except that the notch is formed in the control board 18 instead of the through-hole, the description thereof will be omitted.

As shown in FIG. 18, the control board 18 includes a notch 120 that is formed in the control board 18 and notched from one side 18C of the control board 18. One side 18C is a side positioned at an upper end of the control board 18. As in the case of the through-hole 100 of the first embodiment, the notch 120 has a shape in which at least two substantially rectangular shapes overlap each other and has a shape in which three substantially rectangular shapes overlap each other in the present embodiment. That is, the notch 120 has a shape in which substantially rectangular regions in which the flexible printed boards 90 to 92 are moved overlap each other. The positions of the substantially rectangular regions in which the flexible printed boards 90 to 92 are moved in the notch 120 are the same as the positions of the substantially rectangular regions in the through-hole 100 of the first embodiment.

Further, the notch 120 extends in the Y-axis direction from the substantially rectangular region in which the flexible printed board 91 is moved, and is connected to the one side 18C. Since the notch 120 is formed as described above, a step of connecting the flexible printed boards 90 to 92 to the holding unit 30 and the control board 18 is facilitated. As a result, assembly efficiency is improved.

As shown in FIG. 19, the flexible printed board 90 is interposed between the first guide plate 110 and the second guide plate 98 and includes a semicircular bent portion 90A as in the first embodiment. One end of the flexible printed board 90 is electrically connected to the first connector part 95. The flexible printed board 90 passes through the notch 120 and protrudes toward the rear surface 18B of the control board 18. The other end of the flexible printed board 90 is electrically connected to the second connector part 101. Likewise, one end of the flexible printed board 92 is electrically connected to the first connector part 97 and the other end of the flexible printed board 92 is electrically connected to the second connector part 102. Likewise, the flexible printed board 91 is electrically connected to the second connector part 102.

Further, in a case where a distance between the first connector part 95 and the second connector part 101 in a longitudinal direction of the flexible printed board 90, that is, the Y-axis direction is denoted by L1, a diameter of the bent portion 90A is denoted by d, and a length of the flexible printed board 90 in the Y-axis direction is denoted by L2 as in the first embodiment, a relationship of "$L2>L1+\pi d/2$" is satisfied.

A dimensional relationship between the flexible printed board 90 and the first and second connector parts 95 and 101 is shown in FIG. 19, but a dimensional relationship between the flexible printed board 91 and the fixing cushion part 96 and the second connector part 102 and a dimensional relationship between the flexible printed board 92 and the first and second connector parts 97 and 103 are also expressed in the same manner.

As described above, even in the present embodiment in which the notch 120 is formed in the control board 18, the flexible printed boards 90 to 92 are disposed as in the first embodiment and the imaging element 16 or the coils 60 to 62 are electrically connected to the control board 18 by the flexible printed boards 90 to 92 passing through the notch 120. Accordingly, an effect of reduction in drive load and the like can be obtained as in the first embodiment.

The CPU 93 is exemplified as a processor for controlling the operation of the vibration isolator 15 in each of the above-mentioned embodiments, but a processor as the hardware structure of a processing unit performing various types of processing, such as the CPU 93, is not limited thereto. A graphical processing unit (GPU), a programmable logic device (PLD) that is a processor of which circuit configuration can be changed after manufacture, such as a field programmable gate array (FPGA), a dedicated electrical circuit that is a processor having circuit configuration designed exclusively to perform various types of processing, and the like are included in various processors instead of or in addition to a CPU.

One processing unit may be formed of one of these various processors, or may be formed of a combination of two or more processors of the same type or different types (for example, a plurality of FPGAs, a combination of a CPU an FPGA, a combination of a CPU and a GPU, or the like). Further, a plurality of processing units may be formed of one processor. As an example where a plurality of processing units are formed of one processor, first, there is an aspect where one processor is formed of a combination of one or more CPUs and software as typified by a computer, such as a client or a server, and functions as a plurality of processing units. Second, there is an aspect where a processor fulfilling the functions of the entire system, which includes a plurality of processing units, by one integrated circuit (IC) chip as typified by System On Chip (SoC) or the like is used. In this way, various processing units are formed using one or more of the above-mentioned various processors as hardware structures.

In addition, the hardware structures of these various processors are more specifically electrical circuitry where circuit elements, such as semiconductor elements, are combined.

The present invention can be applied to imaging devices, such as a smartphone and a video camera, in addition to the digital camera.

EXPLANATION OF REFERENCES

10: digital camera
11: camera body
12: imaging lens
13: lens mount
14: imaging aperture
15: vibration isolator
16: imaging element
16A: circuit board
17: imaging surface
18: control board
18A: front surface
18B: rear surface
18C: one side
19: side 20: side
30: holding unit
31: support unit
32: fixing member
33: yoke
35: ball
36: ball
37: ball
40: magnet
41: magnet
42: magnet
43: magnet
45: plate
46: plate
47: plate
48: magnet
51: restriction opening
52: female screw
53: female screw
54: female screw
55: through-hole
60: coil
61: coil
62: coil
65: magnetic body
66: magnetic body
67: magnetic body
70: recessed portion
71: recessed portion
72: recessed portion
75: magnetic body
76: protrusion
80: male screw
81: male screw
82: male screw
83: sliding mechanism
84: sliding mechanism
85: sliding mechanism
88: magnetic force-applying mechanism
90: flexible printed board
90A: bent portion
90B: fitting portion
90C: protruding portion
90D: linear portion
90E: position absorption portion
91: flexible printed board
92: flexible printed board
95: first connector part
96: fixing cushion part
97: first connector part
98: second guide plate
99: mounting component
100: through-hole
100A: region
100B: region
100C: region
101: second connector part
101A: slot
102: second connector part
103: second connector part
110: first guide plate
110A: recessed portion
111: fluorine tape
112: fluorine tape
113: fluorine tape
114: thermally conductive sheet
120: notch
CL: center
d: diameter
L1: distance
L2: length
OA: optical axis
86: first VCM
87: second VCM
α: angle

What is claimed is:

1. An imaging device comprising:
an imaging sensor that includes an imaging surface imaging a subject;
a holding unit that holds the imaging sensor, wherein the holding unit comprises a circuit board;
a support unit that supports the holding unit such that the holding unit is allowed to move in a plane perpendicular to an optical axis, wherein the support unit comprises a yoke;
a motor that drives the holding unit in the plane perpendicular to the optical axis;
a flexible board that is electrically connected to the imaging sensor or the motor;
a control board that is electrically connected to the imaging sensor or the motor via the flexible board;
a through-hole which is formed in the control board and through which the flexible board is to pass;
a first flexible board fixing part which is provided on the holding unit and to which one end of the flexible board is to be fixed; and
a second flexible board fixing part which is provided on the control board and is disposed on a second surface opposite to a first surface facing the imaging sensor and to which the other end of the flexible board is to be fixed,
wherein in a case where a distance between the first and second flexible board fixing parts in a longitudinal direction of the flexible board is denoted by L1, a diameter of a bent portion of the flexible board is denoted by d, and a length of the flexible board in the longitudinal direction is denoted by L2, a relationship of "L2>L1+πd/2" is satisfied.

2. The imaging device according to claim 1,
wherein the flexible board extends in a center direction of the imaging sensor in a plane parallel to the imaging surface.

3. The imaging device according to claim 1,
wherein a plurality of the flexible boards are provided.

4. The imaging device according to claim 1,
wherein a plurality of the flexible boards are provided,
a portion, which extends from the first flexible board fixing part, of at least one of the flexible boards is disposed parallel to a first direction parallel to the imaging surface, and
a portion, which extends from the first flexible board fixing part, of another of the flexible boards is disposed parallel to a second direction parallel to the imaging surface and orthogonal to the first direction.

5. The imaging device according to claim 1, further comprising:
a first plate that is provided on a surface of the control board opposite to a surface of the control board facing the imaging sensor and is in contact with the flexible board.

6. The imaging device according to claim 5, further comprising:
a second plate that is provided on a side of the control board facing the imaging sensor.

7. The imaging device according to claim 6,
wherein the second plate is provided on the holding unit.
8. The imaging device according to claim 6,
wherein the first and second plates include friction reducing parts.
9. An imaging device comprising:
an imaging sensor that includes an imaging surface imaging a subject;
a holding unit that holds the imaging sensor, wherein the holding unit comprises a circuit board;
a support unit that supports the holding unit such that the holding unit is allowed to move in a plane perpendicular to an optical axis, wherein the support unit comprises a yoke;
a motor that drives the holding unit in the plane perpendicular to the optical axis;
a flexible board that is electrically connected to the imaging sensor or the motor;
a control board that is electrically connected to the imaging sensor or the motor via the flexible board;
a notch which is formed in the control board and notched from one side of the control board and through which the flexible board is to pass;
a first plate that is provided on a surface of the control board opposite to a surface of the control board facing the imaging sensor and is in contact with the flexible board;
a first flexible board fixing part which is provided on the holding unit and to which one end of the flexible board is to be fixed; and
a second flexible board fixing part which is provided on the control board and is disposed on a second surface opposite to a first surface facing the imaging sensor and to which the other end of the flexible board is to be fixed,
wherein in a case where a distance between the first and second flexible board fixing parts in a longitudinal direction of the flexible board is denoted by L1, a diameter of a bent portion of the flexible board is denoted by d, and a length of the flexible board in the longitudinal direction is denoted by L2, a relationship of "$L2 > L1 + \pi d/2$" is satisfied.
10. The imaging device according to claim 9,
wherein the flexible board extends in a center direction of the imaging sensor in a plane parallel to the imaging surface.
11. The imaging device according to claim 9,
wherein a plurality of the flexible boards are provided.
12. The imaging device according to claim 9,
wherein a plurality of the flexible boards are provided,
a portion, which extends from the first flexible board fixing part, of at least one of the flexible boards is disposed parallel to a first direction parallel to the imaging surface, and
a portion, which extends from the first flexible board fixing part, of another of the flexible boards is disposed parallel to a second direction parallel to the imaging surface and orthogonal to the first direction.
13. The imaging device according to claim 9,
wherein the first plate is made of a material having a heat dissipation effect.
14. The imaging device according to claim 9, further comprising:
a second plate that is provided on a side of the control board facing the imaging sensor.
15. The imaging device according to claim 14,
wherein the second plate is provided on the holding unit.
16. The imaging device according to claim 14,
wherein the first and second plates include friction reducing parts.
17. An imaging device comprising:
an imaging sensor that includes an imaging surface imaging a subject;
a holding unit that holds the imaging sensor, wherein the holding unit comprises a circuit board;
a support unit that supports the holding unit such that the holding unit is allowed to move in a plane perpendicular to an optical axis, wherein the support unit comprises a yoke;
a motor that drives the holding unit in the plane perpendicular to the optical axis;
a plurality of flexible boards that is electrically connected to the imaging sensor or the motor;
a control board that is electrically connected to the imaging sensor or the motor via the plurality of flexible boards; and
a through-hole which is formed in the control board and through which the plurality of flexible boards is to pass, wherein the through-hole has a shape in which at least two substantially rectangular shapes overlap each other.
18. An imaging device comprising:
an imaging sensor that includes an imaging surface imaging a subject;
a holding unit that holds the imaging sensor, wherein the holding unit comprises a circuit board;
a support unit that supports the holding unit such that the holding unit is allowed to move in a plane perpendicular to an optical axis, wherein the support unit comprises a yoke;
a motor that drives the holding unit in the plane perpendicular to the optical axis;
a plurality of flexible boards that is electrically connected to the imaging sensor or the motor;
a control board that is electrically connected to the imaging sensor or the motor via the plurality of flexible board;
a notch which is formed in the control board and notched from one side of the control board and through which the plurality of flexible boards is to pass, wherein the notch has a shape in which at least two substantially rectangular shapes overlap each other; and
a first plate that is provided on a surface of the control board opposite to a surface of the control board facing the imaging sensor and is in contact with the plurality of flexible boards.

* * * * *